(12) United States Patent
Baek et al.

(10) Patent No.: US 9,608,040 B2
(45) Date of Patent: Mar. 28, 2017

(54) MEMORY DEVICE AND METHOD OF FABRICATING THE SAME

(71) Applicants: Gwang-Hyun Baek, Seoul (KR); Inho Kim, Suwon-si (KR); Jong-Kyu Kim, Seongnam-si (KR); Jongchul Park, Seongnam-si (KR); Jung-Ik Oh, Hwaseong-si (KR)

(72) Inventors: Gwang-Hyun Baek, Seoul (KR); Inho Kim, Suwon-si (KR); Jong-Kyu Kim, Seongnam-si (KR); Jongchul Park, Seongnam-si (KR); Jung-Ik Oh, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/158,981

(22) Filed: May 19, 2016

(65) Prior Publication Data
US 2017/0053965 A1    Feb. 23, 2017

(30) Foreign Application Priority Data
Aug. 21, 2015  (KR) .................. 10-2015-0118177

(51) Int. Cl.
| H01L 43/12 | (2006.01) |
|---|---|
| H01L 27/22 | (2006.01) |
| H01L 43/02 | (2006.01) |
| H01L 43/08 | (2006.01) |
| H01L 43/10 | (2006.01) |
| G11C 11/16 | (2006.01) |
| H01L 23/528 | (2006.01) |

(52) U.S. Cl.
CPC .......... *H01L 27/228* (2013.01); *G11C 11/161* (2013.01); *H01L 23/528* (2013.01); *H01L 43/02* (2013.01); *H01L 43/08* (2013.01); *H01L 43/10* (2013.01); *H01L 43/12* (2013.01)

(58) Field of Classification Search
None
See application file for complete search history.

(56) References Cited

U.S. PATENT DOCUMENTS

| 6,890,770 B2 * | 5/2005 | Grynkewich ......... H01L 27/228 |
|---|---|---|
| | | 257/423 |
| 8,574,928 B2 | 11/2013 | Satoh et al. |
| 8,790,935 B1 * | 7/2014 | Nagel ............... H01L 21/76898 |
| | | 365/158 |

(Continued)

*Primary Examiner* — Michael Lebentritt
(74) *Attorney, Agent, or Firm* — Harness, Dickey & Pierce, P.L.C.

(57) ABSTRACT

A memory device including a substrate, an insulating layer on the substrate, the insulating layer including a first region having a first top surface and a second region having a second top surface, the second top surface being lower than the first top surface with respect to the substrate, the first region including a first through hole penetrating therethrough, the second region including a second through hole penetrating therethrough, a first conductive pattern filling the first through hole, a second conductive pattern at least partially filling the second through hole, a magnetic tunnel junction pattern on the first conductive pattern, and a contact plug coupled to the second conductive pattern may be provided. Further, a method of fabricating the memory device also may be provided.

20 Claims, 29 Drawing Sheets

(56) References Cited

U.S. PATENT DOCUMENTS

| | | |
|---|---|---|
| 8,796,041 B2 | 8/2014 | Assefa et al. |
| 8,796,042 B2 | 8/2014 | Shin et al. |
| 8,895,323 B2 | 11/2014 | Guha |
| 8,912,012 B2 | 12/2014 | Li et al. |
| 2004/0120185 A1* | 6/2004 | Kang ............... G01N 27/76 365/158 |
| 2005/0020076 A1 | 1/2005 | Lee et al. |
| 2005/0035386 A1* | 2/2005 | Ha ................. H01L 43/12 257/296 |
| 2006/0097298 A1* | 5/2006 | Ho ................. G11C 11/16 257/295 |
| 2009/0261434 A1* | 10/2009 | Kang ............... H01L 43/08 257/421 |
| 2010/0264501 A1* | 10/2010 | Furuta .............. B82Y 10/00 257/421 |
| 2012/0056253 A1* | 3/2012 | Iwayama ........... H01L 27/228 257/295 |
| 2013/0058162 A1* | 3/2013 | Yamanaka ......... H01L 43/08 365/173 |
| 2014/0015080 A1 | 1/2014 | Kang et al. |
| 2014/0087483 A1* | 3/2014 | Ohsawa ............ H01J 37/08 438/3 |
| 2014/0269005 A1* | 9/2014 | Kang ............... H01L 45/1666 365/148 |
| 2014/0284743 A1 | 9/2014 | Aikawa et al. |
| 2015/0021726 A1 | 1/2015 | Min et al. |
| 2015/0035031 A1 | 2/2015 | Kim |
| 2015/0044781 A1 | 2/2015 | Tokashiki |
| 2015/0069559 A1* | 3/2015 | Tsubata ............ H01L 43/02 257/421 |
| 2015/0104882 A1 | 4/2015 | Jung et al. |
| 2015/0111309 A1 | 4/2015 | Lee et al. |
| 2016/0072048 A1* | 3/2016 | Ito ................. H01L 43/08 257/421 |
| 2016/0149123 A1* | 5/2016 | Park ................ H01J 37/3172 438/3 |
| 2016/0218145 A1* | 7/2016 | Han ................ H01L 27/222 |

* cited by examiner

MEMORY DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2015-0118177, filed on Aug. 21, 2015, in the Korean Intellectual Property Office, the entire contents of which are hereby incorporated by reference.

BACKGROUND

Example embodiments of the inventive concepts relate to memory devices and/or methods of fabricating the same, and in particular, to memory devices including a magnetic tunnel junction and methods of fabricating the same.

Due to increasing demands for high speed, low power electronic devices, a faster operating speed and/or a lower operating voltage are desired for memory devices to be in the electronic devices. Magnetic memory devices have been suggested as a candidate device to satisfy such demands. For example, the magnetic memory device can provide, for example, reduced latency and/or non-volatility. Thus, the magnetic memory device is emerging as a next-generation memory device.

The magnetic memory device may include a plurality of magnetic tunnel junctions (MTJ), each of which includes two magnetic layers and a tunnel barrier layer interposed therebetween. Resistance of the magnetic tunnel junction may vary depending on magnetization directions of the two magnetic layers. The resistance of the magnetic tunnel junction is higher when magnetization directions of the magnetic layers are anti-parallel to each other than when they are parallel to each other. This difference in resistance can be used as a data storing mechanism for the magnetic memory device.

Recently, a spin-transfer-torque magnetic random access memory (STT-MRAM) is regarded as a promising high-density memory device because this device can perform a write operation with less current, even when a magnetic memory cell is scaled down.

SUMMARY

Some example embodiments of the inventive concepts provide a highly reliable memory device.

Some example embodiments of the inventive concepts provide a method of fabricating a highly reliable memory device.

According to an example embodiment, a memory device includes a substrate, an insulating layer on the substrate, the insulating layer including a first region having a first top surface and a second region having a second top surface, the second top surface being lower than the first top surface with respect to the substrate, the first region including a first through hole penetrating therethrough, the second region including a second through hole penetrating therethrough, a first conductive pattern filling the first through hole, a second conductive pattern at least partially filling the second through hole, a magnetic tunnel junction pattern on the first conductive pattern, and a contact plug coupled to the second conductive pattern.

In some example embodiments, a top surface of the second conductive pattern may be one of substantially coplanar with and under the second top surface of the second region of the insulating layer.

In some example embodiments, the memory device may further include a protection pattern on the second conductive pattern.

In some example embodiments, the first conductive pattern may include a metallic material and the protection pattern may include a metallic oxide material.

In some example embodiments, a top surface of the protection pattern may be one of substantially coplanar with and above the second top surface of the second region of the insulating layer.

In some example embodiments, the memory device may further include an insulating cover layer covering a sidewall of the magnetic tunnel junction pattern, which includes a first magnetic pattern, a second magnetic pattern, and a tunnel barrier pattern interposed therebetween.

According to an example embodiment, a memory device includes a substrate, an insulating layer on the substrate, the insulating layer including a first region having a first top surface and a second region having a second top surface recessed with respect to the first top surface, the first region including a first through hole penetrating therethrough, the second region including a second through hole penetrating therethrough, a first conductive pattern filling the first through hole, a second conductive pattern at least partially filling the second through hole, a protection pattern on the second conductive pattern, a magnetic tunnel junction pattern electrically connected to a top surface of the first conductive pattern, and a contact plug electrically connected to a top surface of the second conductive pattern, while penetrating the protection pattern such that a residual portion of the protection pattern remains around a bottom portion of the contact plug.

In some example embodiments, the first conductive pattern may include a metallic material and the protection pattern may include a metallic oxide material.

In some example embodiments, the top surface of the second conductive pattern may be one of substantially coplanar with and under the second top surface of the second region of the insulating layer.

In some example embodiments, a top surface of the protection pattern may be one of substantially coplanar with and above the second top surface of the second region of the insulating layer.

In some example embodiments, the memory device may further include an insulating cover layer covering a sidewall of the magnetic tunnel junction pattern, and the magnetic tunnel junction pattern may include a first magnetic pattern, a second magnetic pattern, and a tunnel barrier pattern interposed therebetween. The insulating cover layer may include a same material as the protection pattern.

According to an example embodiment, a magnetic memory device includes a substrate, an insulating layer on the substrate, the insulating layer including a first region having a first top surface, a second region having a second top surface, and a third region having a third top surface, the third top surface being lower than the first and second top surfaces with respect to the substrate, the first, second, and third regions including first, second, and third through holes penetrating therethrough, respectively, a first conductive pattern and a second conductive pattern filling the first and second through holes, respectively, a third conductive pattern at least partially filling the third through hole, a first magnetic tunnel junction pattern including a first electrode, a second electrode, and a first tunnel barrier pattern interposed therebetween, the first electrode electrically connected to the first conductive pattern, a second magnetic tunnel junction pattern including a third electrode, a fourth electrode, and a second tunnel barrier pattern interposed therebetween, the third electrode electrically connected to the second conductive pattern, and a contact plug electrically connected to the third conductive pattern.

In some embodiments, the first and second electrodes of the first magnetic tunnel junction pattern may be a fixed pattern and a free pattern of the first magnetic tunnel junction pattern, respectively, and the third and fourth electrodes of the second magnetic tunnel junction pattern may be a fixed pattern and a free pattern of the second magnetic tunnel junction pattern, respectively.

In some example embodiments, the magnetic memory device may further include a first bit line electrically connected to the free pattern of the first magnetic tunnel junction pattern, and a second bit line connected to the fixed pattern of the second magnetic tunnel junction pattern.

In some example embodiments, the magnetic memory device may further include an interconnection pattern electrically connecting the free pattern of the second magnetic tunnel junction pattern to the contact plug.

In some example embodiments, the magnetic memory device may further include a first selection transistor electrically connected to the first conductive pattern, and a second selection transistor electrically connected to the third conductive pattern.

In some example embodiments, the magnetic memory device may further include a common source line connected in common to source regions of both the first selection transistor and the second selection transistor.

In some example embodiments, the magnetic memory device may further include a protection pattern on the third conductive pattern.

In some example embodiments, the first and second conductive patterns may include a metallic material, the protection pattern may include a metallic oxide material, and the contact plug may be provided through the protection pattern such that the protection pattern remains at around a bottom portion of the third conductive pattern.

In some example embodiments, a top surface of the protection pattern may be one of substantially coplanar with and above the third top surface of the third region of the insulating layer.

According to an example embodiment, a magnetic memory device includes a substrate, a first level structure including a first insulating layer on the substrate, the first insulating layer including a first region having a first top surface and a second region having a second top surface, the second top surface being lower than the first top surface with respect to the substrate, the first region including a first through hole penetrating therethrough, the second region including a second through hole penetrating therethrough, a first conductive pattern filling the first through hole, a second conductive pattern at least partially filling the second through hole, a first magnetic tunnel junction pattern electrically connected to the first conductive pattern, and a first contact plug electrically connected to the second conductive pattern, and a second level structure on the first level structure, the second level structure including, a second insulating layer including a third region having a third top surface and a fourth region having a fourth top surface, the third top surface being lower than the fourth top surface with respect to the substrate, the third region including a third through hole penetrating therethrough, the fourth region including a fourth through hole penetrating therethrough, a third conductive pattern at least partially filling the third through hole and electrically connected to the first magnetic tunnel junction pattern of the first level structure, a fourth conductive pattern filling the fourth through hole and connected to the first contact plug of the first level structure, a second magnetic tunnel junction pattern electrically connected to the fourth conductive pattern, and a second contact plug electrically connected to the third conductive pattern.

In some example embodiments, the magnetic memory device may further include a first bit line electrically connected to the second contact plug, and a second bit line electrically connected to the second magnetic tunnel junction pattern.

In some example embodiments, the magnetic memory device may further include a first selection transistor electrically connected to the first conductive pattern, and a second selection transistor electrically connected to the second conductive pattern.

In some example embodiments, the magnetic memory device may further include a common source line electrically connected in common to source regions of both the first selection transistor and the second selection transistor.

In some example embodiments, a top surface of the second conductive pattern may be one of substantially coplanar with and under the second top surface of the second region of the first insulating layer.

In some example embodiments, a top surface of the third conductive pattern may be one of substantially coplanar with and under the third top surface of the third region of the second insulating layer.

In some example embodiments, the magnetic memory device may further include at least one of a first protection pattern on the second conductive pattern, and a second protection pattern on the third conductive pattern.

In some example embodiments, the first to fourth conductive patterns may include a metallic material and the first and second protection patterns may include a metallic oxide material.

In some example embodiments, at least one of the first and second contact plugs may be provided through at least a corresponding one of the first and second protection patterns.

In some example embodiments, when the magnetic memory device includes the first protection pattern, a top surface of the first protection pattern may be one of substantially coplanar with and above the second top surface of the second region of the first insulating layer, and when the magnetic memory device includes the second protection pattern, a top surface of the second protection pattern may be one of substantially coplanar with and above the third top surface of the third region of the second insulating layer.

In some example embodiments, a top surface of the second conductive pattern may be one of substantially coplanar with and under the second top surface of the second region of the first insulating layer, and a top surface of the third conductive pattern may be one of substantially coplanar with and under the third top surface of the third region of the second insulating layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
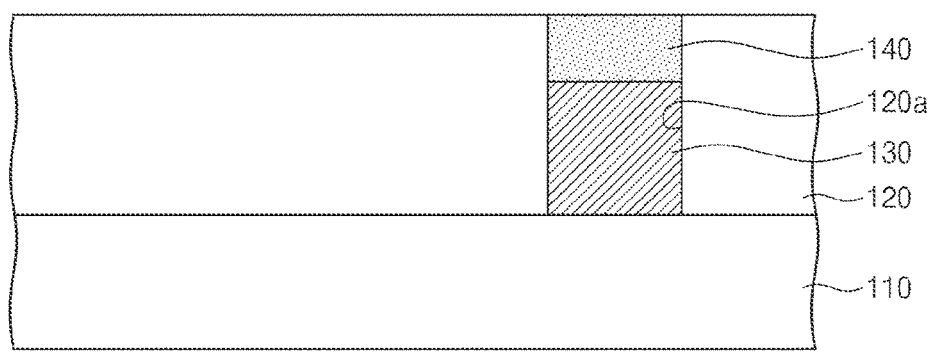
FIGS. 1A through 1I are sectional views illustrating a method of fabricating a memory device, according to an example embodiment of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Various example embodiments of the inventive concepts will now be described more fully with reference to the accompanying drawings, in which some example embodiments are shown. Example embodiments of the inventive concepts may, however, be embodied in many different forms and should not be construed as being limited to the example embodiments set forth herein; rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, some example embodiments will be explained in further detail with reference to the accompanying drawings.

FIGS. 1A through 1I are sectional views illustrating a method of fabricating a memory device, according to an example embodiment of the inventive concepts. FIG. 1J is an enlarged sectional view illustrating a portion 'A' of FIG. 1I. FIGS. 2A and 2B are sectional views illustrating an example of a method of forming a first conductive pattern and a protection pattern, according to an example embodiment of the inventive concepts. FIGS. 3A through 3D are sectional views illustrating another example of a method of forming a first conductive pattern and a protection pattern, according to an example embodiment of the inventive concepts.

Figure 2A:
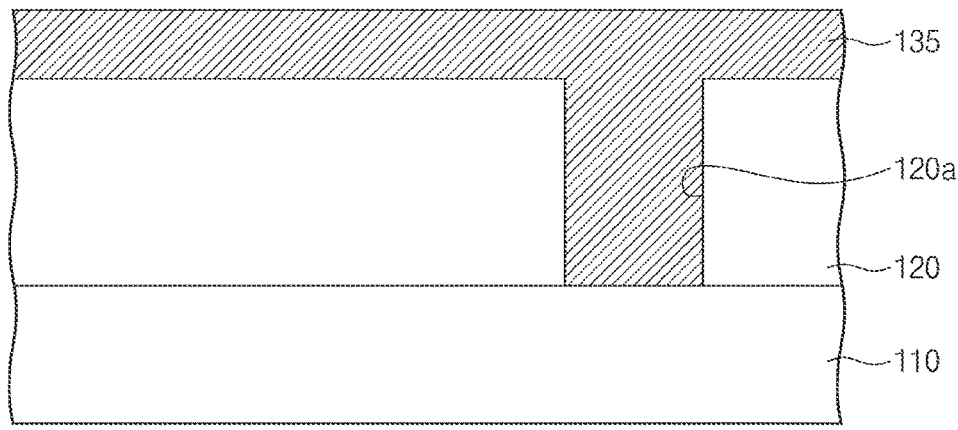
FIGS. 2A and 2B are sectional views illustrating an example of a method of forming a first conductive pattern and a protection pattern, according to an example embodiment of the inventive concepts.
Figure 2B:
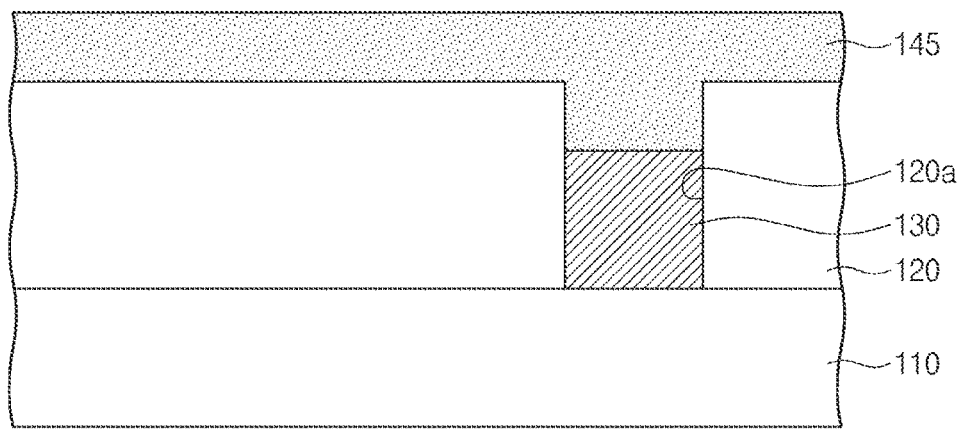

Referring to FIG. 1A, a lower insulating layer 120 may be formed on a substrate 110. The substrate 110 may include selection elements (not shown), for example, diodes or transistors.

The lower insulating layer 120 may include a first through hole 120a extending therethrough from a top surface to a bottom surface thereof. In some example embodiments, the substrate 110 may be partially exposed by the first through hole 120a. The lower insulating layer 120 may be formed of or include at least one of silicon oxide, silicon nitride, or silicon oxynitride. The lower insulating layer 120 may be formed by, for example, a chemical vapor deposition (CVD) process or a physical vapor deposition (PVD) process.

A first conductive pattern 130 may fill at least a portion of the first through hole 120a. In some example embodiments, the first conductive pattern 130 may be electrically connected to the substrate 110. The first conductive pattern 130 may have a top surface positioned at lower level than that of the lower insulating layer 120. In this disclosure, the term 'level' refers to height from a top surface of the substrate 110. The first conductive pattern 130 may include a conductive material. As an example, the first conductive pattern 130 may be formed of or include at least one of metallic materials, for example, copper, aluminum, tungsten, or titanium.

A protection pattern 140 may cover the top surface of the first conductive pattern 130. The protection pattern 140 may fill the remaining space of the first through hole 120a, in which the first conductive pattern 130 is provided. For example, a side surface of the first conductive pattern 130 may be covered by the lower insulating layer 120 and a top surface of the first conductive pattern 130 may be covered by the protection pattern 140. Thus, the first conductive pattern 130 may not be exposed to the outside. The protection pattern 140 may include an insulating material. As an example, the protection pattern 140 may be formed of or include at least one of metal oxides, for example, copper oxide, aluminum oxide, tungsten oxide, or titanium oxide. In the case where the first conductive pattern 130 contains a metallic material, the protection pattern 140 may include a metal oxide compound. The metallic material of the protection pattern may be the same as the metallic material contained in the first conductive pattern 130. As an example, in the case where the first conductive pattern 130 includes tungsten, the protection pattern 140 may include tungsten oxide. As another example, in the case where the first conductive pattern 130 includes titanium, the protection pattern 140 may include titanium oxide.

FIGS. 2A and 2B illustrate an example of a method for forming the first conductive pattern 130 and the protection pattern 140.

Referring to FIG. 2A, a conductive layer 135 may be formed while filling the first through hole 120a. The conductive layer 135 may be formed of or include at least one of metallic materials, for example, copper, aluminum, tungsten, or titanium.

Referring to FIG. 2B, the conductive layer 135 may be partially oxidized to form an oxide layer 145. For example, the oxide layer 145 may be formed by oxidizing some portions of the conductive layer 135 on the lower insulating layer 120 and in an upper portion of the first through hole 120a. The remaining portion of the conductive layer 135 (e.g., a lower portion of the conductive layer 135 in the first through hole 120a) may not be oxidized during the oxidation process, and thus, it may be used as the conductive pattern 130. The oxidation process may be performed using, for example, an oxygen ion beam or oxygen ashing process.

Referring back to FIG. 1A, a planarization process may be performed until the top surface of the lower insulating layer 120 is exposed. For example, the planarization process may be performed to remove a portion of the oxide layer 145 on the top surface of the lower insulating layer 120. Accordingly, the protection pattern 140 may be locally formed in the first through hole 120a.

FIGS. 3A through 3D illustrate another example of a method for forming the first conductive pattern 130 and the protection pattern 140.

Figure 3A:
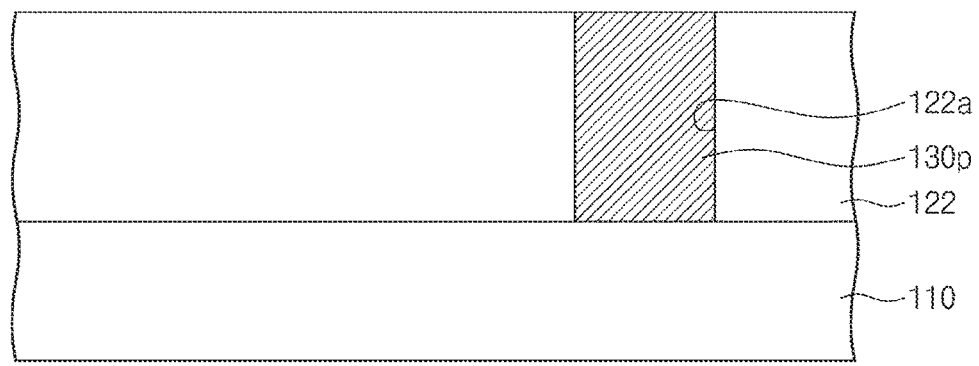
FIGS. 3A through 3D are sectional views illustrating another example of a method of forming a first conductive pattern and a protection pattern, according to an example embodiment of the inventive concepts.

Referring to FIG. 3A, a first lower insulating layer 122 with a through hole 122a may be formed on the substrate 110. Thereafter, a preliminary first conductive pattern 130p may be formed to fill the through hole 122a. The formation of the preliminary first conductive pattern 130p may include forming a conductive layer (not shown) to fill the through hole 122a and planarizing the conductive layer until the top surface of the first lower insulating layer 122 is exposed. The preliminary first conductive pattern 130p may be formed of or include at least one of metallic materials, for example, copper, aluminum, tungsten, or titanium.

Figure 3B:
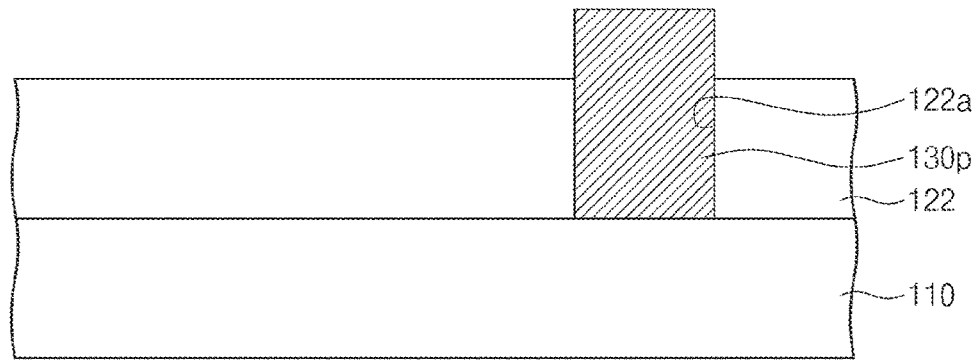

Referring to FIG. 3B, a top portion of the first lower insulating layer 122 may be etched or recessed to expose an upper portion of the preliminary first conductive pattern 130p.

Figure 3C:
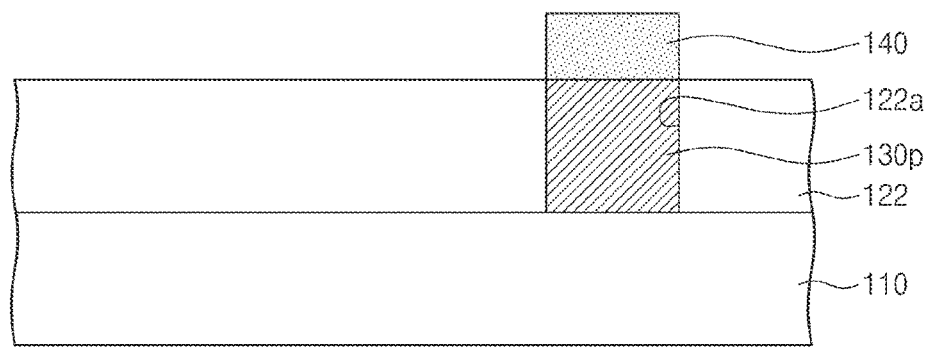

Referring to FIG. 3C, the protection pattern 140 may be formed by oxidizing the exposed upper portion of the preliminary first conductive pattern 130p. A portion of the preliminary first conductive pattern 130p located in the through hole 122a may not be oxidized in the oxidation process, thereby serving as the first conductive pattern 130. The oxidation of the upper portion of the preliminary first conductive pattern 130p may be performed using, for example, an oxygen ion beam or oxygen ashing process.

Figure 3D:
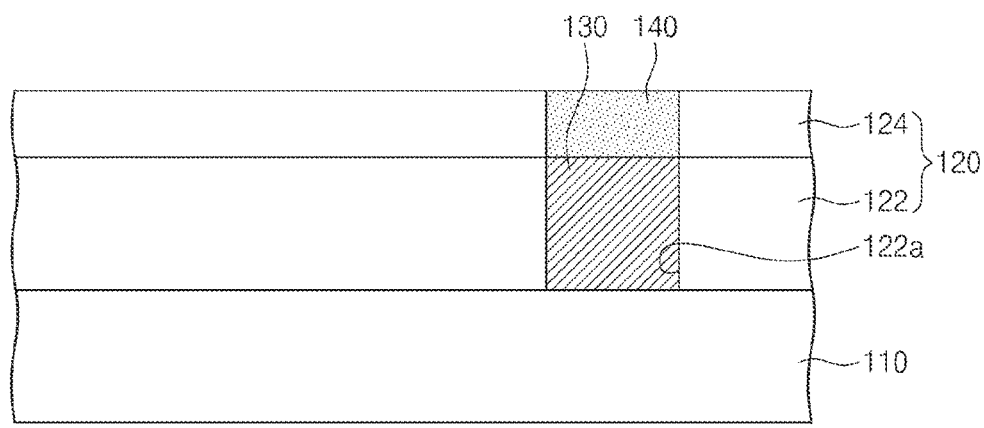

Referring to FIG. 3D, a second lower insulating layer 124 may be formed to cover a sidewall of the protection pattern 140. The formation of the second lower insulating layer 124 may include forming an insulating layer (not shown) on the first lower insulating layer 122 to cover the protection pattern 140 and planarizing the insulating layer to expose the top surface of the protection pattern 140. The first and second lower insulating layers 122 and 124 may be used as constituting parts of the lower insulating layer 120.

Although some methods for forming the first conductive pattern 130 and the protection pattern 140 have been described with reference to FIGS. 2A and 2B and FIGS. 3A through 3D, but example embodiments of the inventive concepts are not limited thereto.

Figure 1B:
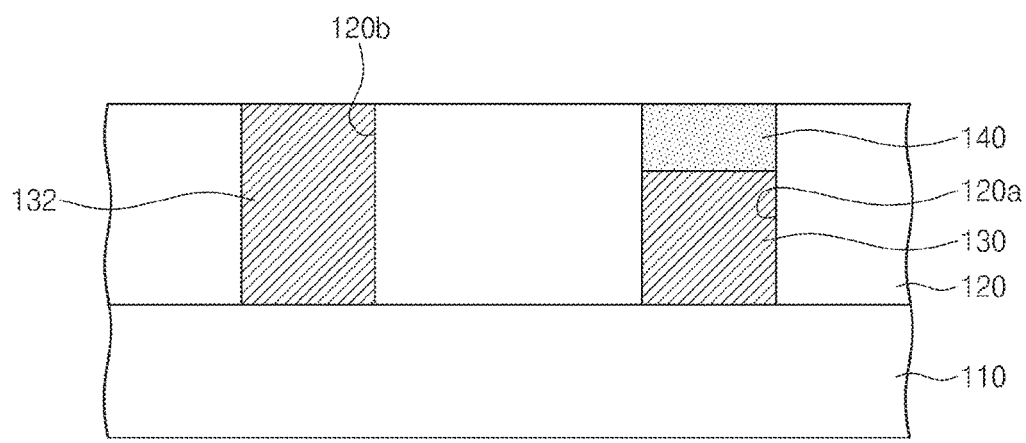

Referring to FIG. 1B, a second conductive pattern 132 may be formed to pass through the lower insulating layer 120. The formation of the second conductive pattern 132 may include forming a second through hole 120b extending throughout from the top surface to the bottom surface of the lower insulating layer 120, forming a conductive layer (not shown) to fill the second through hole 120b, and planarizing the conductive layer until the top surface of the lower insulating layer 120 and/or the top surface of the protection pattern 140 are/is exposed. Accordingly, the lower insulating layer 120, the second conductive pattern 132, and the protection pattern 140 may have top surfaces that are substantially coplanar with each other. The second conductive pattern 132 may include a conductive material. As an example, the second conductive pattern 132 may be formed of or include at least one of metallic materials (e.g., copper, aluminum, tungsten, titanium, etc.).

Figure 1C:
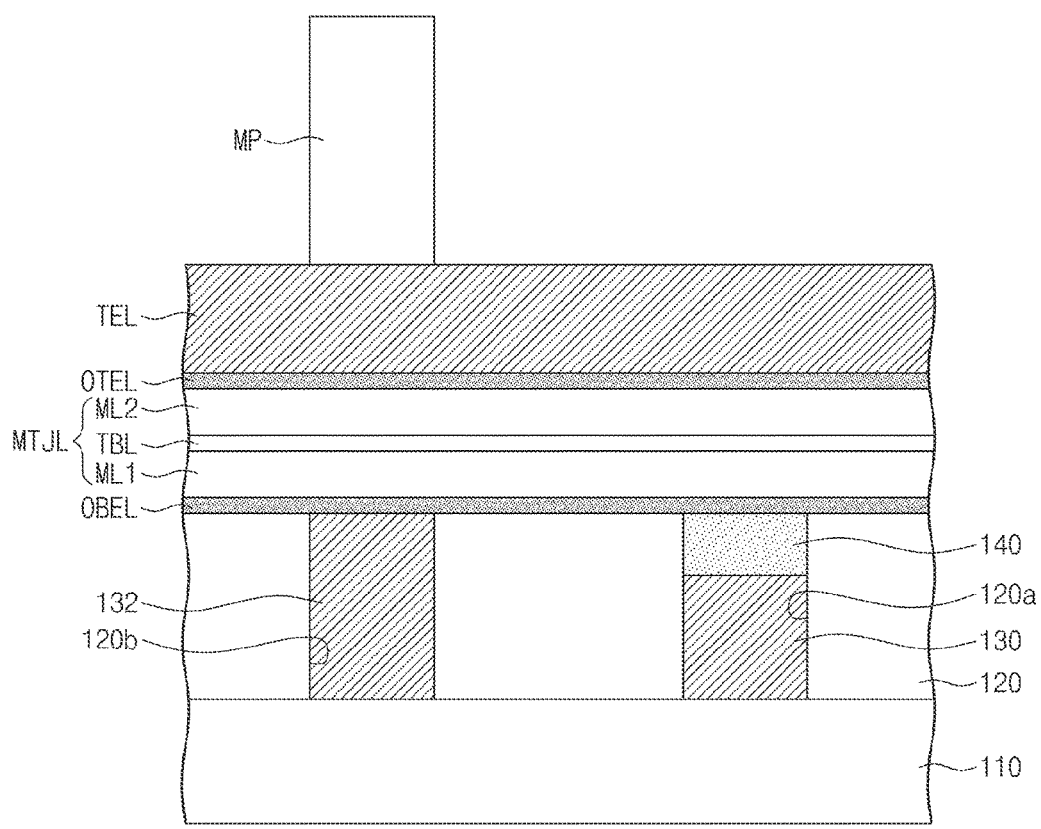

Referring to FIG. 1C, an optional bottom electrode layer OBEL, a magnetic tunnel junction layer MTJL, an optional top electrode layer OTEL, and a top electrode layer TEL may be sequentially formed on the lower insulating layer 120. Each of the layers OBEL, MTJL, OTEL, and TEL may be formed by, for example, a CVD or PVD process.

The optional bottom electrode layer OBEL and the optional top electrode layer OTEL may include at least one of conductive metal nitrides, such as titanium nitride and/or tantalum nitride. The optional bottom electrode layer OBEL may be formed to be in contact with the top surface of the second conductive pattern 132. In some example embodiments, the formation of the optional bottom electrode layer OBEL and the optional top electrode layer OTEL may be omitted. Hereinafter, for the sake of simplicity, the description that follows will refer to example embodiments in which the optional bottom electrode layer OBEL and the optional top electrode layer OTEL are provided, but example embodiments of the inventive concepts are not limited thereto.

The magnetic tunnel junction layer MTJL may include a first magnetic layer ML1, a tunnel barrier layer TBL, and a second magnetic layer ML2, which are sequentially stacked on the substrate 110. The magnetic tunnel junction layer MTJL will be described in more detail with reference to FIGS. 4A and 4B.

The top electrode layer TEL may be formed of or include at least one of metals (e.g., tungsten, tantalum, aluminum, copper, gold, silver, titanium) or conductive metal nitrides thereof.

A mask pattern MP may be formed on the top electrode layer TEL. When viewed in a plan view, the mask pattern MP may be, at least partially, overlapped with the second conductive pattern 132. Further, when viewed in a plan view, the mask pattern MP may be formed spaced apart from the first conductive pattern 130. The mask pattern MP may include, for example, at least one of silicon oxide, silicon nitride, or silicon oxynitride.

Figure 1D:
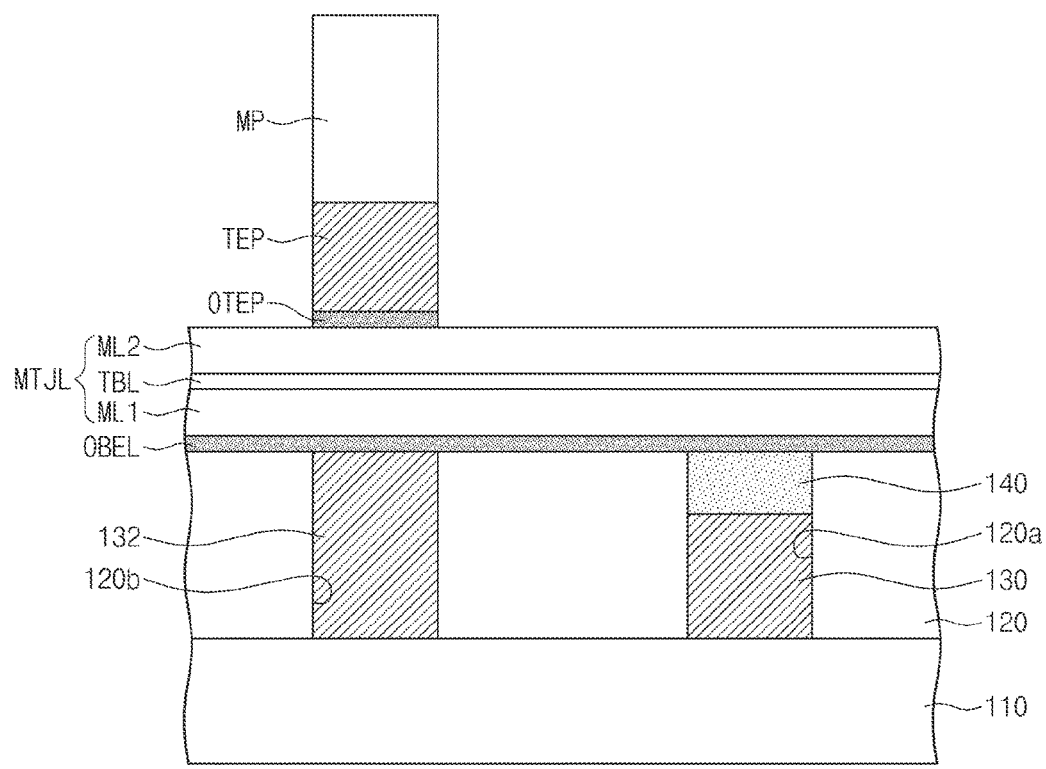

Referring to FIG. 1D, a top electrode pattern TEP and an optional top electrode pattern OTEP may be formed. The formation of the top electrode pattern TEP and the optional top electrode pattern OTEP may include sequentially patterning the top electrode layer TEL and the optional top electrode layer OTEL using the mask pattern MP as an etch mask. The patterning process may be performed using a dry etching process (e.g., a reactive ion etching (RIE) process).

Figure 1E:
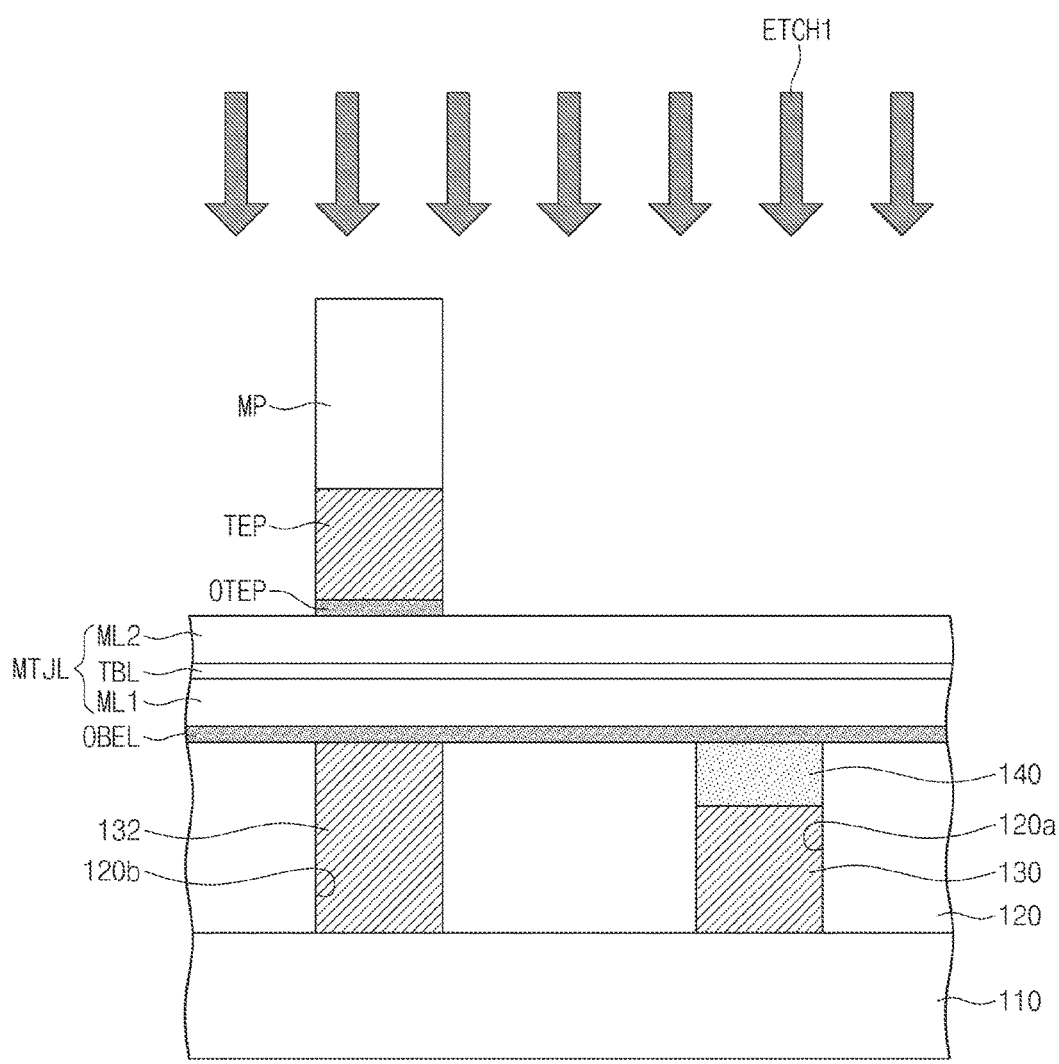
Figure 1F:
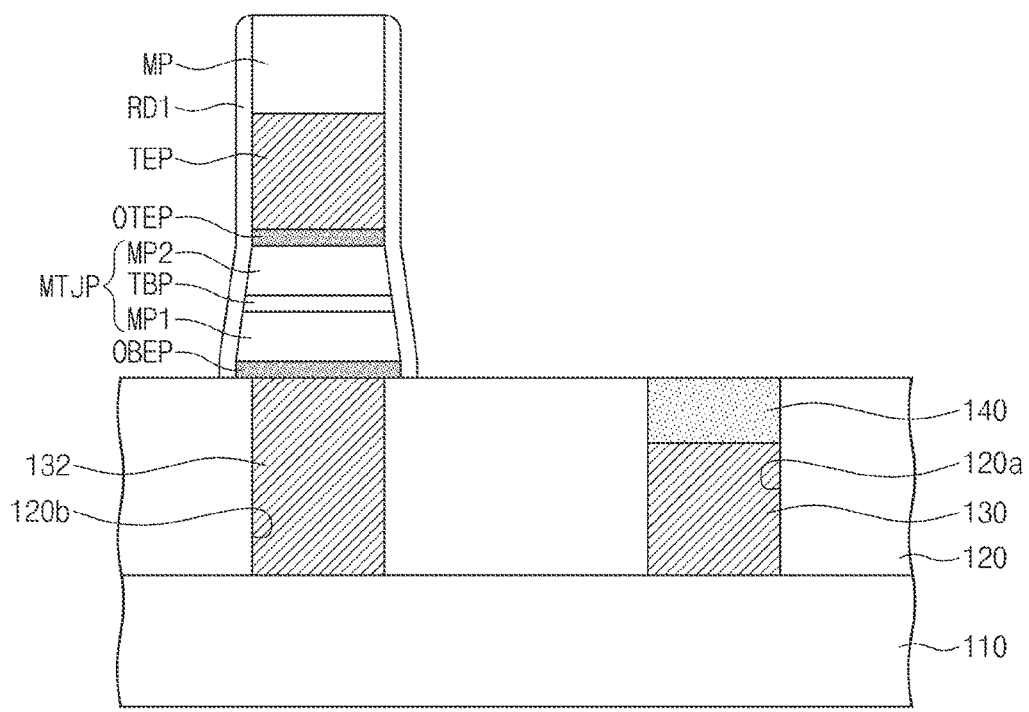
Figure 1G:
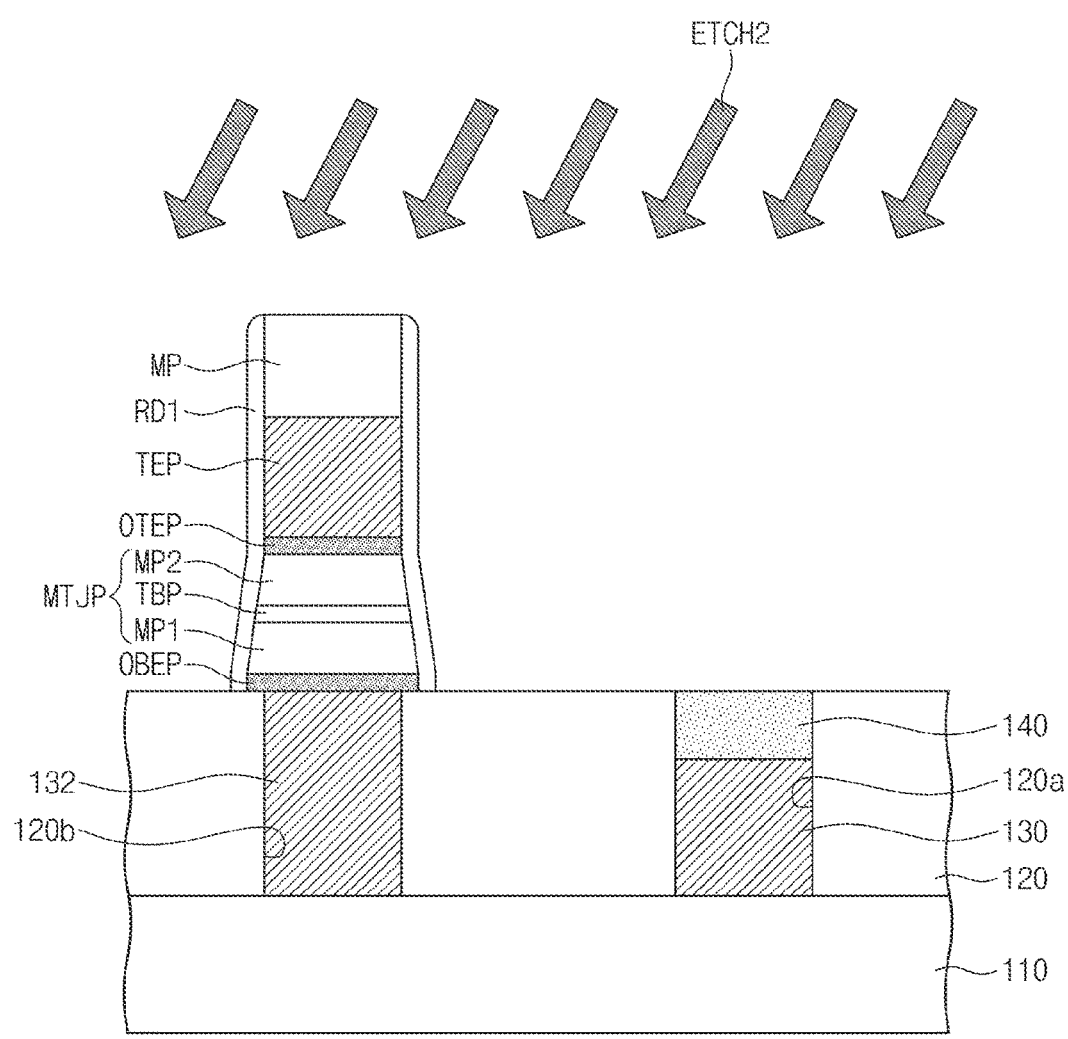
Figure 1H:
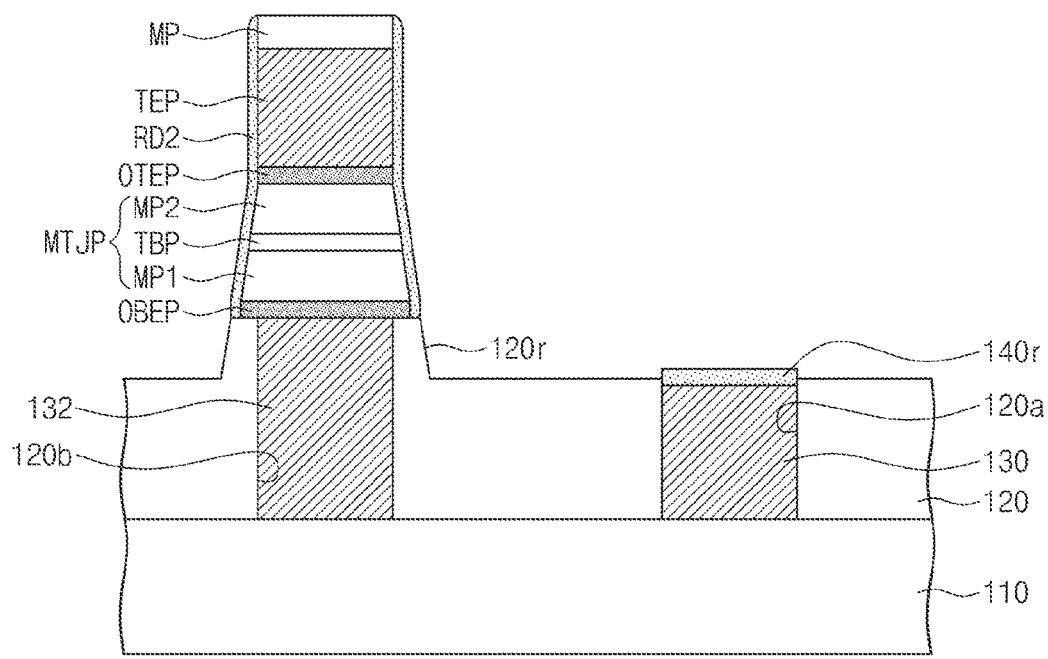

Referring to FIGS. 1E and 1H, a magnetic tunnel junction pattern MTJP and an optional bottom electrode pattern OBEP may be formed on the second conductive pattern 132. The formation of the magnetic tunnel junction pattern MTJP and the optional bottom electrode pattern OBEP may include patterning the magnetic tunnel junction layer MTJL and the optional bottom electrode layer OBEL using the mask pattern MP as an etch mask. The patterning of the magnetic tunnel junction layer MTJL and the optional bottom electrode layer OBEL may include sequentially performing a first etching process ETCH1 and a second etching process ETCH2 on the structure including the magnetic tunnel junction layer MTJL.

For example, as shown in FIGS. 1E and 1H, the first etching process ETCH1 may be performed. The first etching process ETCH1 may be a sputter etching process using inactive or inert gas, for example, argon. As an example, as shown in FIG. 1E, in the first etching process ETCH1, atoms or ions of the inactive gas may be accelerated toward the substrate 110 in a direction substantially normal to the top surface of the substrate 110 to collide against the structure including the magnetic tunnel junction layer MTJL.

In some example embodiments, as a result of the first etching process ETCH1, the magnetic tunnel junction pattern MTJP may be formed to expose the top surfaces of the lower insulating layer 120 and the protection pattern 140. When viewed in a plan view, the magnetic tunnel junction pattern MTJP may be spaced apart from the first conductive pattern 130 and may be, at least partially, overlapped with the second conductive pattern 132. The magnetic tunnel junction pattern MTJP may include a first magnetic pattern MP1, a tunnel barrier pattern TBP, and a second magnetic pattern MP2, which are sequentially stacked on the substrate 110. The magnetic tunnel junction pattern MTJP will be described in more detail with reference to FIGS. 4A and 4B.

As shown in FIG. 1F, as a result of the first etching process ETCH1, a first re-deposition layer RD1 may be formed on a sidewall of the magnetic tunnel junction pattern MTJP. During or after the first etching process ETCH1, a part of the magnetic tunnel junction layer MTJL may be re-deposited on the magnetic tunnel junction pattern MTJP, thereby forming the first re-deposition layer RD1. In this case, the first re-deposition layer RD1 may include the same material as the magnetic tunnel junction layer MTJL. In some example embodiments, the first re-deposition layer RD1 may extend to cover sidewalls of the optional bottom electrode pattern OBEP, the optional top electrode pattern OTEP, the top electrode pattern TEP, and the mask pattern MP.

As shown in FIGS. 1G and 1H, the second etching process ETCH2 may be performed to remove the first re-deposition layer RD1. For example, the second etching process ETCH2 may be a sputter etching process, which is performed using inactive or inert gas, for example, argon. As an example, in the second etching process ETCH2, atoms or ions of the inactive gas may be accelerated toward the substrate 110 at an angle to collide against the structure including the first re-deposition layer RD1, as shown in FIG. 1G. Accordingly, atoms or ions of the inactive gas may collide against the first re-deposition layer RD1 formed on the sidewall of the magnetic tunnel junction pattern MTJP, and as a result of such a collision, the first re-deposition layer RD1 may be removed. In some example embodiments, the second etching process ETCH2 may be performed continuously after the first etching process ETCH1 by tilting the substrate 110 from its original position. However, example embodiments of the inventive concepts are not limited thereto, and the first and second etching processes ETCH1 and ETCH2 may be performed in a separated manner.

During the second etching process ETCH2, at least a portion of the protection pattern 140 may be etched. In some example embodiments, the protection pattern 140 may be portionially etched to leave a remaining portion 140r, as shown in FIG. 1H. The remaining portion 140r of the protection pattern may cover the top surface of the first conductive pattern 130 so that the top surface of the first conductive pattern 130 is not exposed. In certain example embodiments, unlike FIG. 1H, the entire portion of the protection pattern 140 may be etched, and the top surface of the first conductive pattern 130 may be exposed.

As shown in FIG. 1H, as a result of the second etching process ETCH2, a second re-deposition layer RD2 may be formed on the sidewall of the magnetic tunnel junction pattern MTJP. During or after the second etching process ETCH2, a portion of the protection pattern 140 may be re-deposited on the sidewall of the magnetic tunnel junction pattern MTJP, thereby forming the second re-deposition layer RD2. For example, etch residues of the protection pattern 140, which are produced from the collision of the inactive gas onto the protection pattern 140, may be adhered on the sidewall of the magnetic tunnel junction pattern MTJP. Accordingly, the second re-deposition layer RD2 may include the same material as the protection pattern 140. The second re-deposition layer RD2 may extend to cover sidewalls of the optional bottom electrode pattern OBEP, the optional top electrode pattern OTEP, the top electrode pattern TEP, and the mask pattern MP.

As a result of the second etching process ETCH2, a portion of the lower insulating layer 120 may be etched to form a recess region 120r defined by the etched top surface of the lower insulating layer 120. When viewed in a plan view, the portion of the lower insulating layer 120 overlapped with the magnetic tunnel junction pattern MTJP may not be recessed. In the second etching process ETCH2, an etch rate of the lower insulating layer 120 may be faster than that of the protection pattern 140. Accordingly, the bottom surface of the recess region 120r may be positioned at a lower level than the top surface of the remaining portion of the protection pattern 140r. In some example embodiments, as shown in FIG. 1H, the bottom surface of the recess region 120r may be positioned at a higher level than the top surface of the first conductive pattern 130, and thus, the sidewall of the first conductive pattern 130 may not be exposed. In certain example embodiments, unlike that shown in FIG. 1H, the bottom surface of the recess region 120r may be positioned at a lower level than the top surface of the first conductive pattern 130.

Figure 1I:
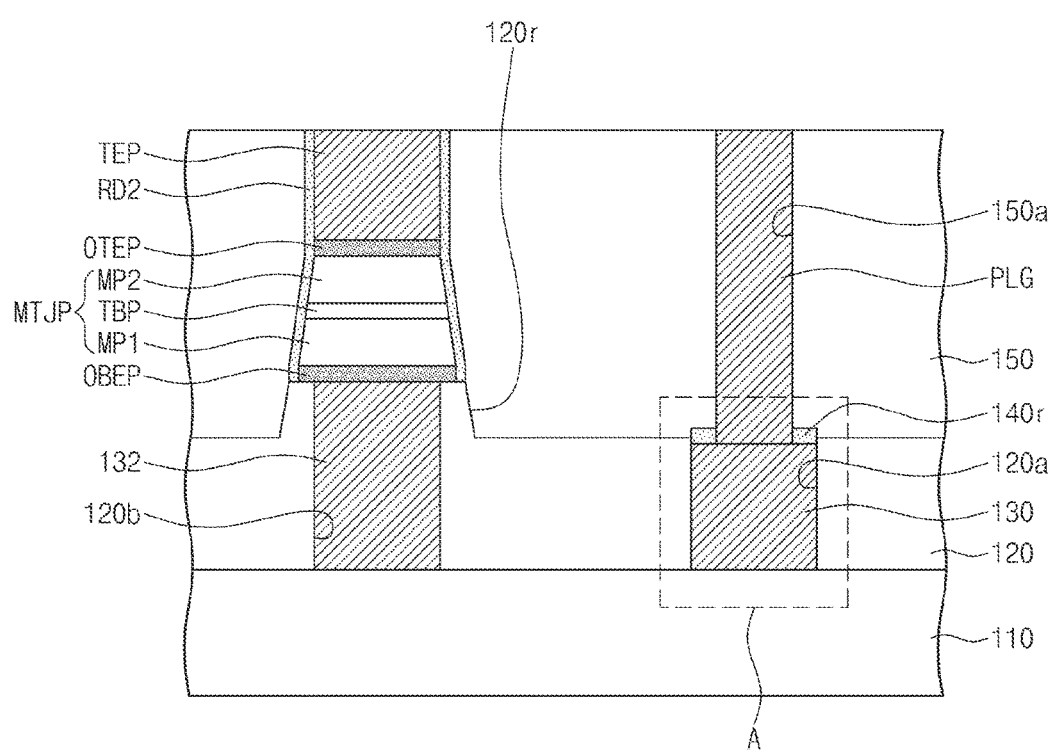
Figure 1J:
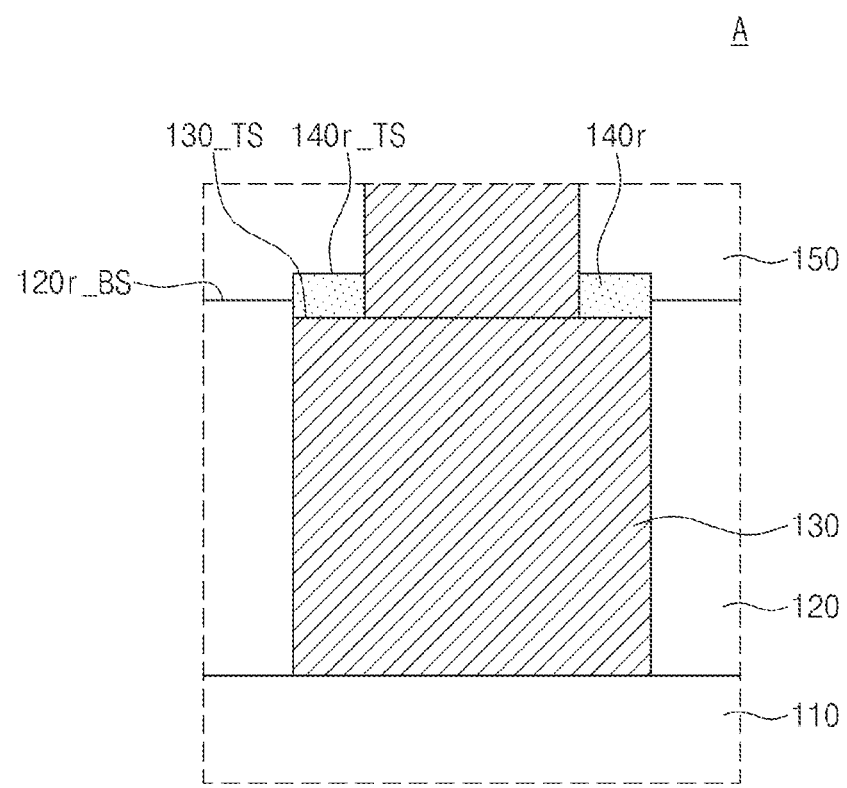
FIG. 1J is an enlarged sectional view illustrating a portion 'A' of FIG. 1I.

Referring to FIGS. 1I and 1J, an interlayer insulating layer 150 may be formed to cover the top surface of the lower insulating layer 120. The interlayer insulating layer 150 may cover the second re-deposition layer RD2. The interlayer insulating layer 150 may include, for example, at least one of silicon oxide, silicon nitride, or silicon oxynitride. The interlayer insulating layer 150 may be formed by, for example, a CVD or PVD process.

A contact plug PLG may be formed to pass through the interlayer insulating layer 150 and may be electrically connected to the first conductive pattern 130. The contact plug PLG may be formed to pass through the remaining portion of the protection pattern 140r. The formation of the contact plug PLG may include forming a third through hole 150a to pass through the interlayer insulating layer 150 and the protection pattern 140r until the top surface of the first conductive pattern 130 is exposed, forming a conductive layer (not shown) to fill the third through hole 150a, and performing a planarization process to expose the top surface of the top electrode pattern TEP.

In a method of fabricating a memory device according to some example embodiments of the inventive concepts, the protection pattern 140 may be formed on the first conductive pattern 130. The protection pattern 140 may prevent the first conductive pattern 130 from being etched in the etching process (e.g., the first and/or second etching processes) for forming the magnetic tunnel junction pattern MTJP, thereby mitigating or preventing the first conductive film 130 from being re-deposited on the sidewall of the magnetic tunnel junction pattern MTJP. Accordingly, a short circuit between the first and second magnetic patterns MP1 and MP2 of the magnetic tunnel junction pattern MTJP may be mitigated or prevented.

In a method of fabricating a memory device according to some example embodiments of the inventive concepts, a portion of the protection pattern 140 may be etched and re-deposited on the sidewall of the magnetic tunnel junction pattern MTJP, during the etching process for forming the magnetic tunnel junction pattern MTJP. Because the protection pattern 140 includes an insulating material, the re-deposition of the protection pattern 140 may not cause to an electric short between the first and second magnetic patterns MP1 and MP2 of the magnetic tunnel junction pattern MTJP.

Some structural features of the semiconductor device fabricated by the method according to some example embodiments of the inventive concepts will be described with reference to FIGS. 1I and 1J.

Referring to FIGS. 1I and 1J, the lower insulating layer 120 may be provided on the substrate 110. The substrate 110 may include selection elements (not shown), for example, diodes or transistors. The lower insulating layer 120 may be provided such that a portion of the top surface of the lower insulating layer 120 defines the recess region 120r. The lower insulating layer 120 may be formed of or include, for example, at least one of silicon oxide, silicon nitride, or silicon oxynitride.

The lower insulating layer 120 may have the first and second through holes 120a and 120b extending therethrough from a top surface to a bottom surface thereof. The first through hole 120a may be formed to pass through the recessed portion of the lower insulating layer 120, and the second through hole 120b may be formed to pass through the un-recessed portion of the lower insulating layer 120. For example, when viewed in a plan view, the first through hole 120a may be overlapped with the recess region 120r, and the second through hole 120b may be spaced apart from the recess region 120r.

The first and second conductive patterns 130 and 132 may be provided in the first and second through holes 120a and 120b, respectively. The first conductive pattern 130 may be provided to fill at least a portion of the first through hole 120a, and the second conductive pattern 132 may be provided to fill the second through hole 120b. The first conductive pattern 130 may have a top surface 130_TS, which is positioned at a lower level than the top surface of the second conductive pattern 132. In some example embodiments, the top surface 130_TS of the first conductive pattern 130 may be lower than the bottom surface 120r_BS of the recess region 120r, but example embodiments of the inventive concepts are not limited thereto. The top surface of the second conductive pattern 132 may be higher than the bottom surface 120r_BS of the recess region 120r. The first and second conductive patterns 130 and 132 may include at least one of conductive materials. As an example, the first and second conductive patterns 130 and 132 may be formed of or include at least one of metallic materials, for example, copper, aluminum, tungsten, or titanium.

The protection pattern 140r may be provided to cover the top surface 130_TS of the first conductive pattern 130. At least a portion of the protection pattern 140r may fill the remaining space of the first through hole 120a on the first conductive pattern 130. The top surface 140r_TS of the protection pattern 140r may be positioned at a higher level than the bottom surface 120r_BS of the recess region 120r. Furthermore, the top surface 140r_TS of the protection pattern 140r may be positioned at a lower level than the top surface of the second conductive pattern 132. The protection pattern 140r may include at least one of insulating materials. As an example, the protection pattern 140r may be formed of or include at least one of metal oxides (e.g., copper oxide, aluminum oxide, tungsten oxide, titanium oxide, etc.). In the case where the first conductive pattern 130 contains a metallic material, the protection pattern 140r may include a metal oxide compound. The metallic material of the protection pattern 140r may be the same as the metallic material of the first conductive pattern 130. As an example, in the case where the first conductive pattern 130 includes tungsten, the protection pattern 140r may include tungsten oxide. As another example, in the case where the first conductive pattern 130 includes titanium, the protection pattern 140r may include titanium oxide.

The optional bottom electrode pattern OBEP, the magnetic tunnel junction pattern MTJP, the optional top electrode pattern OTEP, and the top electrode pattern TEP may be sequentially stacked on the second conductive pattern 132. Sidewalls of the optional bottom electrode pattern OBEP, the magnetic tunnel junction pattern MTJP, the optional top electrode pattern OTEP, and the top electrode pattern TEP may be substantially coplanar with each other.

The optional bottom electrode pattern OBEP and the optional top electrode pattern OTEP may include at least one of conductive metal nitrides, for example, titanium nitride or tantalum nitride. The top electrode pattern TEP may be formed of or include at least one of metals (e.g., tungsten, tantalum, aluminum, copper, gold, silver, titanium) and conductive metal nitrides including the metals.

The magnetic tunnel junction pattern MTJP may include the first magnetic pattern MP1, the tunnel barrier pattern TBP, and the second magnetic pattern MP2, which are sequentially stacked on the substrate 110. The magnetic tunnel junction pattern MTJP will be described in more detail with reference to FIGS. 4A and 4B.

The second re-deposition layer RD2 may be provided on the sidewall of the magnetic tunnel junction pattern MTJP. In some example embodiments, the second re-deposition layer RD2 may extend to cover the sidewalls of the optional bottom electrode pattern OBEP, the optional top electrode pattern OTEP, and the top electrode pattern TEP. The second re-deposition layer RD2 may be formed of or include the same material as the protection pattern 140r. As an example, in the case where the protection pattern 140r is formed of tungsten oxide, the second re-deposition layer RD2 may be formed of or include tungsten oxide. As another example, in the case where the protection pattern 140r is formed of titanium oxide, the second re-deposition layer RD2 may be formed of or include titanium oxide.

The interlayer insulating layer 150 may be provided to cover the top surface of the lower insulating layer 120. The interlayer insulating layer 150 may cover the second re-deposition layer RD2. The interlayer insulating layer 150 may be formed of or include, for example, at least one of silicon oxide, silicon nitride, or silicon oxynitride.

The contact plug PLG may be provided to pass through the interlayer insulating layer 150 and may be electrically connected to the first conductive pattern 130. The contact plug PLG may also be provided to pass through the protection pattern 140r.

Figure 4A:
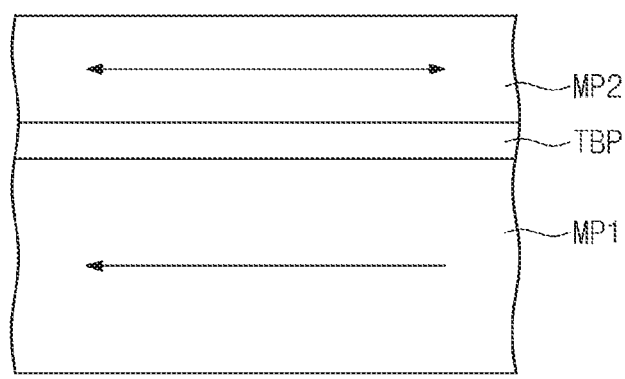
FIGS. 4A and 4B are schematic diagrams illustrating magnetization directions of magnetic tunnel junction patterns according to an example embodiment of the inventive concepts.
Figure 4B:
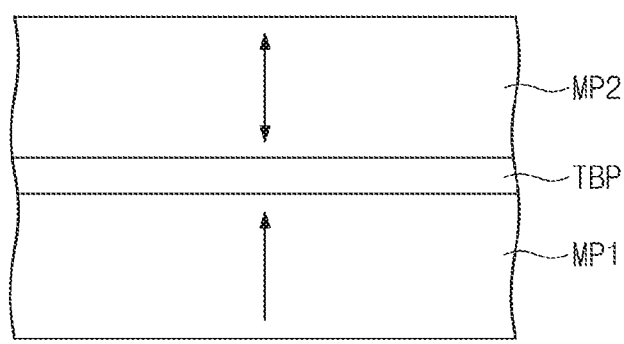

FIGS. 4A and 4B are schematic diagrams illustrating magnetization directions of magnetic tunnel junction patterns according to an example embodiment of the inventive concepts. The magnetic tunnel junction pattern MTJP may include the first magnetic pattern MP1, the tunnel barrier pattern TBP, and the second magnetic pattern MP2. One of the first magnetic pattern MP1 and the second magnetic pattern MP2 may serve as a free pattern of a magnetic tunnel junction (MTJ), and the other may serve as a fixed (or alternatively, pinned) pattern of the MTJ. For the sake of simplicity, the description that follows will refer to example embodiments in which the first and second magnetic patterns MP1 and MP2 are used as fixed and free patterns, respectively, but in certain example embodiments, the first and second magnetic patterns MP1 and MP2 may be used as the free and fixed patterns, respectively. Electrical resistance of the magnetic tunnel junction pattern MTJP may be sensitive to a relative orientation of magnetization directions of the free and fixed patterns. For example, the electric resistance of the magnetic tunnel junction pattern MTJP may be much higher when magnetization directions of the free and fixed patterns are anti-parallel than when they are parallel. This means that the electric resistance of the magnetic tunnel junction pattern MTJP can be controlled by changing the magnetization direction of the free pattern with respect to the direction of the fixed pattern, and the magnetic memory devices according to example embodiments of the inventive concepts may be realized based on this data-storing mechanism.

Referring to FIG. 4A, the first magnetic pattern MP1 and the second magnetic pattern MP2 may be configured to have an in-plane magnetization structure. For example, each of the first and second magnetic patterns MP1 and MP2 may be or include at least one magnetic layer, whose magnetization direction is substantially parallel to a top surface of the tunnel barrier pattern TBP. In some example embodiments, the first magnetic pattern MP1 may include two layers, one of which includes an antiferromagnetic material, and the other of which includes a ferromagnetic material. The antiferromagnetic material may include, for example, at least one of PtMn, IrMn, MnO, MnS, MnTe, MnF$_2$, FeCl$_2$, FeO, CoCl$_2$, CoO, NiCl$_2$, NiO, or Cr. In some example embodiments, the layer including the antiferromagnetic material may include at least one of precious metals. The precious metals may include, for example, ruthenium (Ru), rhodium (Rh), palladium (Pd), osmium (Os), iridium (Ir), platinum (Pt), gold (Au), or silver (Ag). The ferromagnetic material may include, for example, at least one of CoFeB, Fe, Co, Ni, Gd, Dy, CoFe, NiFe, MnAs, MnBi, MnSb, CrO$_2$, MnOFe$_2$O$_3$, FeOFe$_2$O$_3$, NiOFe$_2$O$_3$, CuOFe$_2$O$_3$, MgOFe$_2$O$_3$, EuO, or Y$_3$Fe$_5$O$_{12}$.

The second magnetic pattern MP2 may be configured to have a variable or switchable magnetization direction. For example, the second magnetic pattern MP2 may include, for example, a ferromagnetic material. As an example, the second magnetic pattern MP2 may be formed of or include, for example, at least one of FeB, Fe, Co, Ni, Gd, Dy, CoFe, NiFe, MnAs, MnBi, MnSb, CrO$_2$, MnOFe$_2$O$_3$, FeOFe$_2$O$_3$, NiOFe$_2$O$_3$, CuOFe$_2$O$_3$, MgOFe$_2$O$_3$, EuO, or Y$_3$Fe$_5$O$_{12}$.

The second magnetic pattern MP2 may include a plurality of layers. For example, the second magnetic pattern MP2 may include a plurality of ferromagnetic layers and at least one non-magnetic layer interposed between the ferromagnetic layers. In this case, the ferromagnetic layers and the non-magnetic layer may constitute a synthetic antiferromagnetic layer. The presence of the synthetic antiferromagnetic layer may reduce a critical current density desired for an operation of the magnetic memory device and improve a thermal stability of the magnetic memory device.

The tunnel barrier pattern TBP may include, for example, at least one of magnesium oxide, titanium oxide, aluminum oxide, magnesium-zinc oxide, magnesium-boron oxide, titanium nitride, or vanadium nitride. As an example, the tunnel barrier pattern TBP may be a single layer of magnesium oxide (MgO). Alternatively, the tunnel barrier pattern TBP may include a plurality of layers. The tunnel barrier pattern TBP may be formed by a CVD process.

Referring to FIG. 4B, the first and second magnetic patterns MP1 and MP2 may be configured to have a perpendicular magnetization structure. For example, each of the first and second magnetic patterns MP1 and MP2 may be or include at least one magnetic layer, whose magnetization direction is substantially normal to the top surface of the tunnel barrier pattern TBP. In some example embodiments, the first and second magnetic patterns MP1 and MP2 may include at least one of materials with an L1$_0$ crystal structure, materials having the hexagonal closed packed structure, or amorphous rare-earth transition metal (RE-TM) alloys. As an example, the first and second magnetic patterns MP1 and MP2 may include at least one of L1$_0$ materials, such as Fe$_{50}$Pt$_{50}$, Fe$_{50}$Pd$_{50}$, Co$_{50}$Pt$_{50}$, Co$_{50}$Pd$_{50}$, and Fe$_{50}$Ni$_{50}$. In other example embodiments, the first and second magnetic patterns MP1 and MP2 may include at least one of cobalt-platinum (CoPt) disordered Hexagonal-Close-Packed (HCP) alloys having a platinum content of 10 to 45 at. % or Co$_3$Pt ordered HCP alloys hexagonal close packed. In still other example embodiments, the first and second magnetic patterns MP1 and MP2 may include at least one of the amorphous rare earth-transition metal (RE-TM) alloys containing at least one of iron (Fe), cobalt (Co), or nickel (Ni) and at least one of rare-earth metals. for example, terbium (Tb), dysprosium (Dy), or gadolinium (Gd).

The first and second magnetic patterns MP1 and MP2 may include a material with an interface perpendicular magnetic anisotropy. The interface perpendicular magnetic anisotropy may refer to a perpendicular magnetization phenomenon, which may be seen at an interface of a magnetic layer with an intrinsically in-plane magnetization property, when the magnetic layer is in contact with another layer. Here, the term "intrinsic in-plane magnetization property" will be used to mean that a magnetization direction of a magnetic layer is oriented parallel to a longitudinal direction thereof, when there is no external magnetic field applied thereto. For example, in the case that a magnetic layer with the intrinsic in-plane magnetization property is formed on a substrate and there is no external magnetic field applied thereto, a magnetization direction of the magnetic layer may be oriented substantially parallel to the top surface of the substrate.

As an example, the first magnetic pattern MP1 and the second magnetic pattern MP2 may include, for example, at least one of cobalt (Co), iron (Fe), or nickel (Ni). The first magnetic pattern MP1 and the second magnetic pattern MP2 may further include, for example, at least one of non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and nitrogen (N). As an example, the first magnetic pattern MP1 and the second magnetic pattern MP2 may include a layer of CoFe or NiFe, in which boron (B) is added. Further, at least one of the first magnetic pattern MP1 and the second magnetic pattern MP2 may further include, for example, at least one of titanium (Ti), aluminum (Al), magnesium (Mg), tantalum (Ta), or silicon (Si) to lower saturation magnetization thereof. The first magnetic pattern MP1 and the second magnetic pattern MP2 may be formed by, for example, a sputtering process or a CVD process.

The magnetic tunnel junction layer MTJL of FIG. 1C may be configured to contain the same material as the magnetic tunnel junction pattern MTJP.

Figure 5:
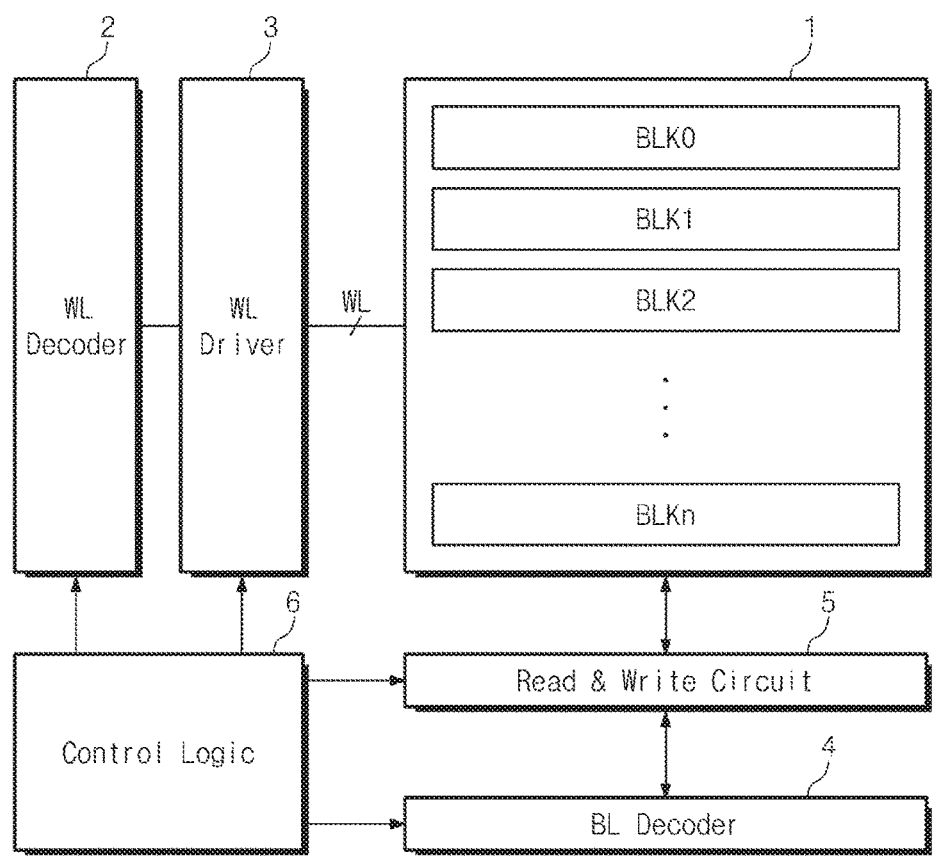
FIG. 5 is a block diagram schematically illustrating a memory device according to an example embodiment of the inventive concepts.

FIG. 5 is a block diagram schematically illustrating a memory device according to an example embodiment of the inventive concepts.

Referring to FIG. 5, a memory device may include a memory cell array 1, a word line decoder 2, a word line driver 3, a bit line decoder 4, a read and write circuit 5, and a control logic 6.

The memory cell array 1 may include a plurality of memory blocks BLK0-BLKn, and each of the memory blocks BLK0-BLKn may include a plurality of memory cells and word lines, bit lines, and source lines that are electrically connected to the memory cells.

The word line decoder 2 may be configured to decode the address information transmitted from the outside and select one of the word lines based on the decoded address information. The address information decoded in the word line decoder 2 may be transmitted to the word line driver 3. Under the control of the control logic 6, the word line driver 3 may provide word line voltages, which are generated by a voltage generating circuit (not shown), to selected and unselected ones of the word lines. The word line decoder 2 and the word line driver 3 may be connected in common to the plurality of memory blocks BLK0-BLKn and may provide a driving signal to the word lines of the selected one of the memory blocks BLK0-BLKn, in response to a block selection signal (not shown).

The bit line decoder 4 may decode address information input from the outside and then select one of the bit lines. The bit line decoder 4 may be connected in common to the plurality of memory blocks BLK0-BLKn and may provide data signals to the bit lines of the selected one of the memory blocks BLK0-BLKn, in response to the block selection signal (not shown).

The read and write circuit 5 may be connected to the memory cell array 1 through the bit lines. The read and write circuit 5 may be configured to select at least one of the bit lines, in response to a bit line selection signal (not shown) from the bit line decoder 4. The read and write circuit 5 may be configured to exchange data with the external device. The read and write circuit 5 may be operated in response to control signals from the control logic 6. The read and write circuit 5 may be configured to receive a power (e.g., voltage or current) transmitted from the control logic 6 and provide it to the selected at least one of the bit lines.

The control logic 6 may control overall operations of the memory device. The control logic 6 may receive control signals and an external voltage and may be operated in response to the received control signals. The control logic 6 may generate powers, which are desired for internal operations of the memory device, using the external voltage. The control logic 6 controls read, write, and/or erase operations in response to the control signals.

Figure 6:
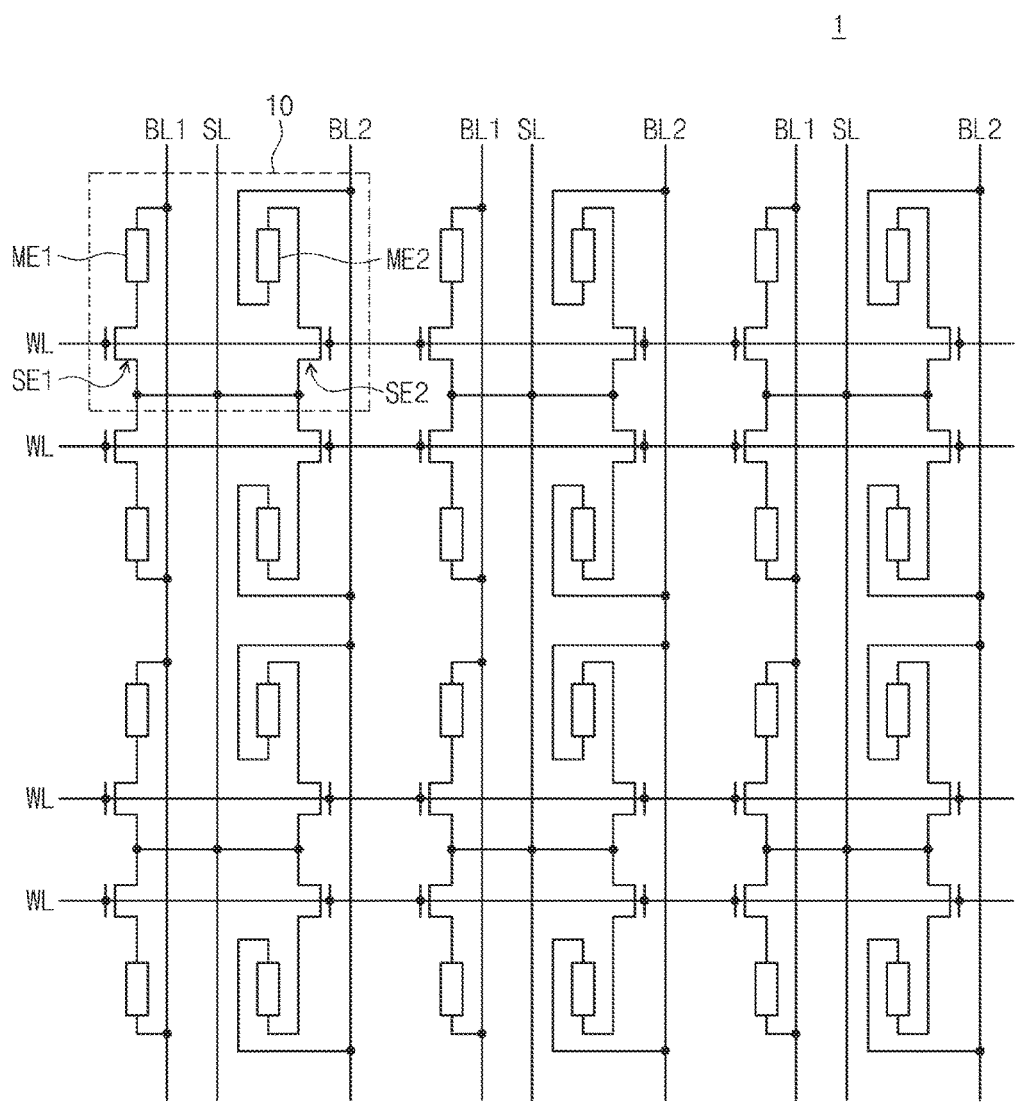
FIG. 6 is a circuit diagram illustrating a memory cell array of a memory device according to an example embodiment of the inventive concepts.

FIG. 6 is a circuit diagram illustrating a memory cell array of a memory device according to an example embodiment of the inventive concepts. For example, FIG. 6 is a circuit diagram illustrating the memory cell array described with reference to FIG. 5.

Referring to FIG. 6, the memory cell array 1 may include a plurality of word lines WL, a plurality of bit lines BL1 and BL2, a plurality of source lines SL, and a plurality of unit memory cells 10. The bit lines BL1 and BL2 may be arranged to cross the word lines WL. As shown in FIG. 6, the source lines SL may be parallel to the bit lines BL1 and BL2. However, example embodiments of the inventive concepts are not limited thereto, and unlike that shown in FIG. 6, the source lines SL may be parallel to the word lines WL.

Each of the unit memory cells 10 may be provided between a corresponding one of the word line WL and a corresponding pair of the bit lines BL1 and BL2. Each of the unit memory cells 10 may include first and second memory elements ME1 and ME2 and first and second selection elements SE1 and SE2.

The first memory element ME1 may be disposed between the first selection element SE1 and the first bit line BL1, and the second memory element ME2 may be disposed between the second selection element SE2 and the second bit line BL2. The first selection element SE1 may be disposed between the first memory element ME1 and the source line SL, and the second selection element SE2 may be disposed between the second memory element ME2 and the source line SL. In each of the unit memory cells 10, the first and second selection elements SE1 and SE2 may share a corresponding one of the source lines SL and may be controlled by a corresponding one of the word lines WL. In certain example embodiments, a plurality of the unit memory cells 10 arranged parallel to the source line SL may be connected in common to the source line SL.

Each of the unit memory cells 10 may be selected by one of the word lines WL and a pair of the bit lines BL1 and BL2. In some example embodiments, each of the first and second memory elements ME1 and ME2 may be a variable resistance element, whose electric resistance can be changed into, for example, one of two different values using an electric pulse applied thereto. The first and second memory elements ME1 and ME2 may be formed of a material, whose resistance is changed depending on a magnitude and/or direction of an electric current or voltage applied thereto, and further, may have a non-volatile data storing property. In some example embodiments, the first and second memory elements ME1 and ME2 may have a structure exhibiting a magneto-resistance property. For example, each of the first and second memory elements ME1 and ME2 may be provided to have substantially the same features as those of the magnetic tunnel junction pattern MTJP described with reference to FIG. 4A or FIG. 4B. In certain example embodiments, the first and second memory elements ME1 and ME2 may contain at least one of perovskite compounds or transition metal oxides.

The first and second selection elements SE1 and SE2 may be one of a diode, a PNP or NPN bipolar transistor, or a NMOS or PMOS field effect transistor. In some example embodiments, the first and second selection elements SE1 and SE2 may control a flow of electric current to be supplied to the first and second memory elements ME1 and ME2, in response to voltages applied to the word lines WL.

Figure 7:
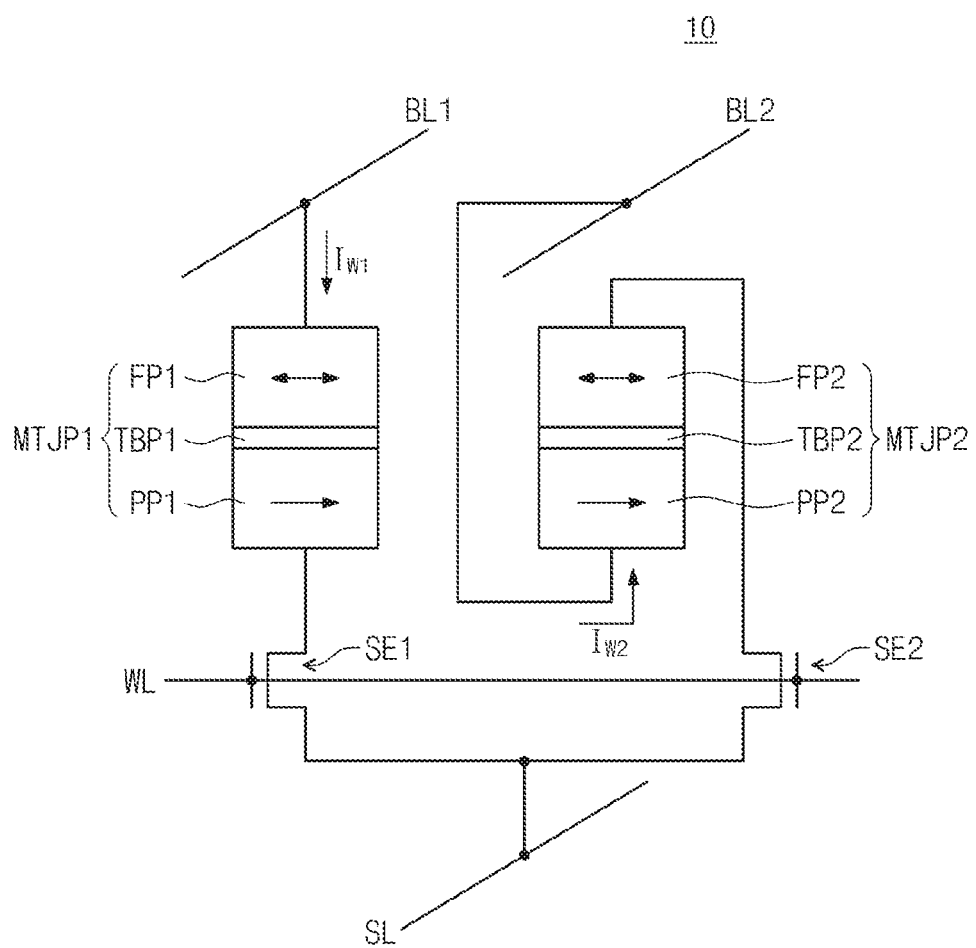
FIG. 7 is a circuit diagram illustrating a unit memory cell of a memory device according to an example embodiment of the inventive concepts.

FIG. 7 is a circuit diagram illustrating a unit memory cell of a memory device according to an example embodiment of the inventive concepts. For example, FIG. 7 may be a circuit diagram illustrating an example of the unit memory cell of FIG. 6.

Referring to FIG. 7, the unit memory cell 10 may include first and second magnetic tunnel junction patterns MTJP1 and MTJP2, which are used as memory elements thereof, and first and second selection transistors SE1 and SE2, which are used as selection elements thereof. The first magnetic tunnel junction pattern MTJP1 may include a first free pattern FP1, a first fixed pattern PP1, and a first tunnel barrier pattern TBP1 interposed therebetween. The second magnetic tunnel junction pattern MTJP2 may include a second free pattern FP2, a second fixed pattern PP2, and a second tunnel barrier pattern TBP2 interposed therebetween. Each of the first and second fixed patterns PP1 and PP2 may have a fixed magnetization direction. The first and second free patterns FP1 and FP2 may have magnetization directions that can be changed to be parallel or antiparallel to the directions of the first and second fixed patterns PP1 and PP2, respectively. In some example embodiments, each of the first and second magnetic tunnel junction patterns MTJP1 and MTJP2 may have substantially the same features as those of the magnetic tunnel junction pattern MTJP described with reference to FIG. 4A or FIG. 4B.

The first and second bit lines BL1 and BL2 may be provided to cross the word lines WL, and the source line SL may be connected in common to the first and second selection transistors SE1 and SE2. The first magnetic tunnel junction pattern MTJP1 may electrically connect the first bit line BL1 to the first selection transistor SE1, and the first selection transistor SE1 may electrically connect the first magnetic tunnel junction pattern MTJP1 to the source line SL. The second magnetic tunnel junction pattern MTJP2 may electrically connect the second bit line BL2 to the second selection transistor SE2, and the second selection transistor SE2 may electrically connect the second magnetic tunnel junction pattern MTJP2 to the source line SL.

In some example embodiments, as shown in FIG. 7, the first free pattern FP1 may be connected to the first bit line BL1, and the first fixed pattern PP1 may be connected to the first selection transistor SE1. In such example embodiments, the second free pattern FP2 may be connected to the second selection transistor SE2, and the second fixed pattern PP2 may be connected to the second bit line BL2.

In certain example embodiments, unlike that shown in FIG. 7, the first fixed pattern PP1 may be connected to the first bit line BL1, and the first free pattern FP1 may be connected to the first selection transistor SE1. In such example embodiments, the second fixed pattern PP2 may be connected to the second selection transistor SE2, and the second free pattern FP2 may be connected to the second bit line BL2. For the sake of simplicity, the description that follows will refer to one of example embodiments in which the first free pattern FP1 is connected to the first bit line BL1, the first fixed pattern PP1 is connected to the first selection transistor SE1, the second free pattern FP2 is connected to the second selection transistor SE2, and the second fixed pattern PP2 is connected to the second bit line BL2.

In some example embodiments, to write data '1' in a selected one of the unit memory cells 10, a turn-on voltage may be applied to the word line WL. A first bit line voltage may be applied to the first and second bit lines BL1 and BL2, and a source line voltage lower than the first bit line voltage may be applied to the source line SL.

Under such voltage conditions, the first and second selection transistors SE1 and SE2 may be turned on to allow the first and second magnetic tunnel junction patterns MTJP1 and MTJP2 to be electrically connected to the source line SL. Also, a first write current $I_{W1}$ may flow from the first bit line BL1 to the source line SL through the first magnetic tunnel junction pattern MTJP1, and a second write current $I_{W2}$ may flow from the second bit line BL2 to the source line SL through the second magnetic tunnel junction pattern MTJP2. Here, the first and second write currents $I_{W1}$ and $I_{W2}$ may pass through the first and second magnetic tunnel junction patterns MTJP1 and MTJP2, respectively, in opposite directions. That is, in such example embodiments, if the first and second bit lines BL1 and BL2 are applied with the same voltage, write currents of opposite directions may be supplied to the first magnetic tunnel junction pattern MTJP1 and the second magnetic tunnel junction pattern MTJP2.

In detail, in the first magnetic tunnel junction pattern MTJP1, the first write current $I_{W1}$ may flow in a direction from the first free pattern FP1 to the first fixed pattern PP1. In other words, electrons of the first write current $I_{W1}$ may be injected into the first magnetic tunnel junction pattern MTJP1 in the direction from the first fixed pattern PP1 toward the first free pattern FP1. In this case, some of such electrons which have the same spin direction as the first fixed pattern PP1 may pass through the first tunnel barrier pattern TBP1 (e.g., through a tunneling effect), and may exert a spin transfer torque to switch the magnetization of the first free pattern FP1. As a result, the magnetization direction of the first free pattern FP1 may be changed to be parallel to that of the first pinned pattern PP1. By contrast, in the second magnetic tunnel junction pattern MTJP2, the second write current $I_{W2}$ may flow in a direction from the second fixed pattern PP2 to the second free pattern FP2. In other words, electrons of the second write current $I_{W2}$ may be injected into the second magnetic tunnel junction pattern MTJP2 in the direction from the second free pattern FP2 toward the second fixed pattern PP2. In this case, some of such electrons which have a spin direction opposite to that of the second pinned pattern PP2 may be reflected from the second tunnel barrier pattern TBP2, and may exert a spin transfer torque to switch the magnetization of the second free pattern FP2. Thus, the second free pattern FP2 may be configured to have a magnetization direction that is antiparallel to that of the second fixed pattern PP2.

As described above, data '1' may be written by configuring the first magnetic tunnel junction pattern MTJP1 to have parallel magnetization directions and configuring the second magnetic tunnel junction pattern MTJP2 to have antiparallel magnetization directions. As a result of writing data '1', the first magnetic tunnel junction pattern MTJP1 may have a relatively low resistance state and the second magnetic tunnel junction pattern MTJP2 may have a relatively high resistance state.

In some example embodiments, to write data '0' in a selected one of the unit memory cells 10, a turn-on voltage may be applied to the word line WL. A second bit line voltage may be applied to the first and second bit lines BL1 and BL2, and a second source line voltage higher than the second bit line voltage may be applied to the source line SL.

Under such voltage conditions, currents flowing in directions opposite to those of the first and second write currents $I_{W1}$ and $I_{W2}$ may be applied to the first and second magnetic tunnel junction patterns MTJP1 and MTJP2, respectively. Accordingly, on the contrary to writing data '1', magnetization directions of the first magnetic tunnel junction pattern MTJP1 may be changed to be antiparallel to each other, and magnetization directions of the second magnetic tunnel junction pattern MTJP2 may be changed to be parallel to each other. As a result writing data '0', the first magnetic tunnel junction pattern MTJP1 may have a relatively high resistance state and the second magnetic tunnel junction pattern MTJP2 may have a relatively low resistance state.

Because, as described above, the first and second magnetic tunnel junction patterns MTJP1 and MTJP2 have resistance states different from each other, one of the first and second magnetic tunnel junction patterns MTJP1 and MTJP2 may be used to define a reference resistance value, when a read operation is performed on the unit memory cell 10. Thus, a finite difference in resistance value between the first and second magnetic tunnel junction patterns MTJP1 and MTJP2 may be realized and can be used as a sensing margin in an operation of reading data from the unit memory cell 10. Accordingly, operational reliability and/or data reliability of the unit memory cell 10 may be improved.

Figure 8:
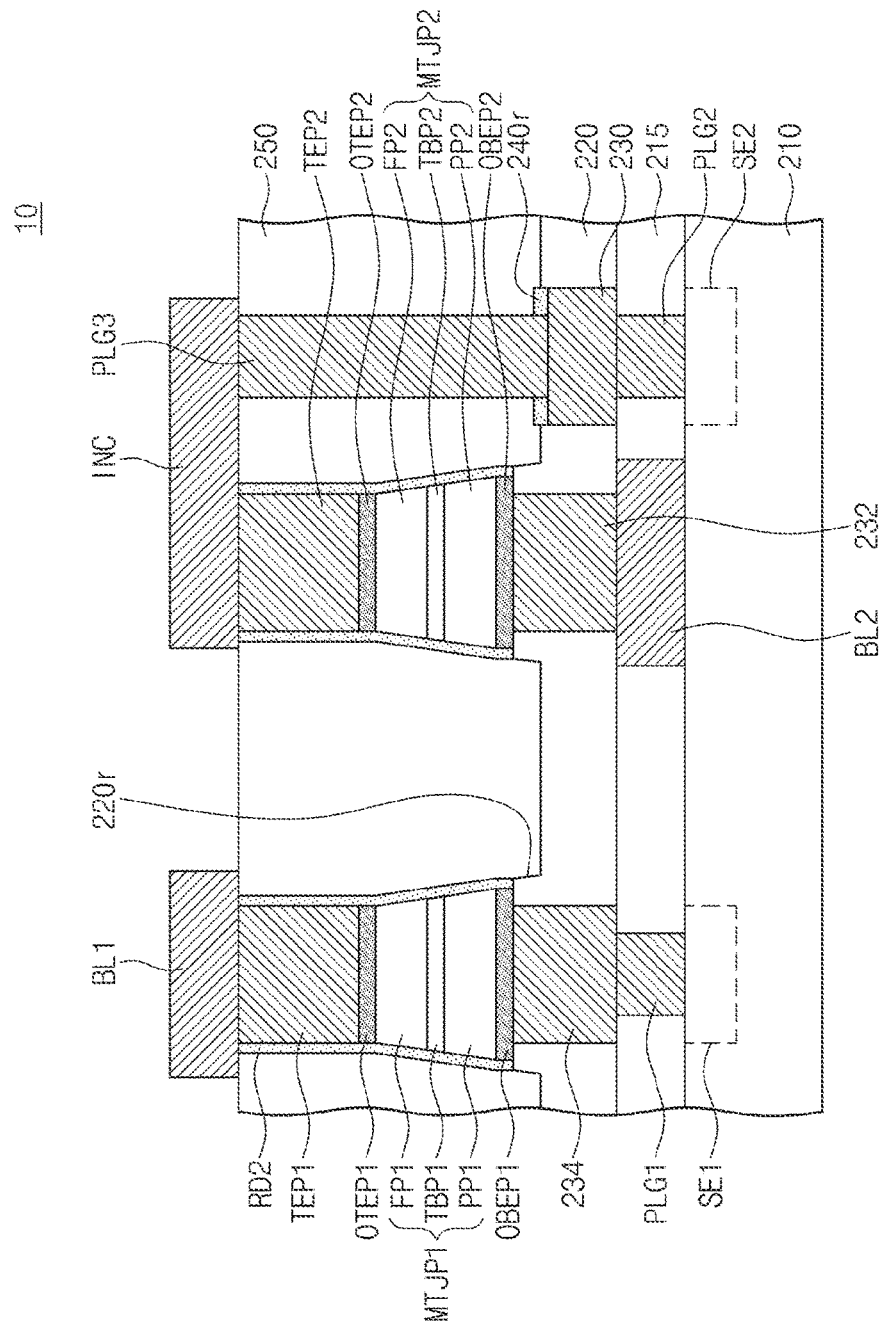
FIG. 8 is a sectional view illustrating an example of a unit memory cell according to an example embodiment of the inventive concepts.

FIG. 8 is a sectional view illustrating an example of a unit memory cell according to an example embodiment of the inventive concepts. For example, FIG. 8 may be a sectional view illustrating the unit memory cell of FIG. 7.

Referring to FIG. 8, a substrate 210 may be provided. The substrate 210 may include the first and second selection transistors SE1 and SE2. The first and second selection transistors SE1 and SE2 may be controlled by one of the word lines. Furthermore, the source line may be connected in common to source regions of the first and second selection transistors SE1 and SE2.

A first lower insulating layer 215 may be provided on the substrate 210. The first lower insulating layer 215 may be formed of or include, for example, at least one of silicon oxide, silicon nitride, or silicon oxynitride.

First and second contact plugs PLG1 and PLG2 and the second bit line BL2 may be provided on the substrate 210. The first contact plug PLG1 may penetrate the first lower insulating layer 215 and may be connected to a drain region (for example, in or on the substrate 210) of the first selection transistor SE1. The second contact plug PLG2 may penetrate the first lower insulating layer 215 and may be connected to a drain region (for example, in or on the substrate 210) of the second selection transistor SE2.

A second lower insulating layer 220 may be provided on the first lower insulating layer 215. The second lower insulating layer 220 may be provided to have technical features similar to those of the first lower insulating layer 120 described with reference to FIGS. 1I and 1J. For example, the second lower insulating layer 220 may have a top surface defining a recess region 220r.

First, second, and third conductive patterns 230, 232, and 234 may be provided. Further, a protection pattern 240r may be provided to cover the top surface of the first conductive pattern 230. The first conductive pattern 230 may be provided to have technical features similar to those of the first conductive pattern 130 described with reference to FIGS. 1I and 1J, and each of the second and third conductive patterns 232 and 234 may be provided to have technical features similar to those of the second conductive pattern 132 described with reference to FIGS. 1I and 1J. The protection pattern 240r may have technical features similar to those of the protection pattern 140r described with reference to FIGS. 1I and 1J.

The first conductive pattern 230 and the protection pattern 240r may pass through the recessed portion of the second lower insulating layer 220, and each of the second and third conductive patterns 232 and 234 may pass through an un-recessed portion of the second lower insulating layer 220. The first conductive pattern 230 may be electrically connected to the second contact plug PLG2, the second conductive pattern 232 may be electrically connected to the second bit line BL2, and the third conductive pattern 234 may be electrically connected to the first contact plug PLG1. In some example embodiments, the first conductive pattern 230 may have a top surface lower than a lowest position of the top surface defining the recess region 220r, but example embodiments of the inventive concepts are not limited thereto. Top surfaces of the second and third conductive patterns 232 and 234 may be higher than the lowermost position of the top surface defining the recess region 220r. The first to third conductive patterns 230, 232, and 234 may include a conductive material. As an example, the first to third conductive patterns 230, 232, and 234 may be formed of or include, for example, at least one of metallic materials, such as copper, aluminum, tungsten, or titanium.

The top surface of the protection pattern 240r may be positioned at a higher level than the lowermost position of the top surface of the recess region 220r. Further, the top surface of the protection pattern 240r may be positioned at a lower level than the top surfaces of the second and third conductive patterns 232 and 234. The protection pattern 240r may include an insulating material. As an example, the protection pattern 240r may be formed of or include at least one of metal oxides (e.g., copper oxide, aluminum oxide, tungsten oxide, titanium oxide, etc.). In the case where the first conductive pattern 230 contains a metallic material, the protection pattern 240r may include a metal oxide compound, the metallic material of which is the same as that contained in the first conductive pattern 230.

A first optional bottom electrode pattern OBEP1, the first magnetic tunnel junction pattern MTJP1, a first optional top electrode pattern OTEP1, and a first top electrode pattern TEP1 may be sequentially stacked on the third conductive pattern 234. A second optional bottom electrode pattern OBEP2, the second magnetic tunnel junction pattern MTJP2, a second optional top electrode pattern OTEP2, and a second top electrode pattern TEP2 may be sequentially stacked on the second conductive pattern 232.

The first and second optional bottom electrode patterns OBEP1 and OBEP2 and the first and second optional top electrode patterns OTEP1 and OTEP2 may include at least one of conductive metal nitrides (e.g., titanium nitride, tantalum nitride, etc.). The first and second top electrode patterns TEP1 and TEP2 may be formed of or include at least one of metals (e.g., tungsten, tantalum, aluminum, copper, gold, silver, titanium, etc.) or conductive metal nitrides thereof.

The first magnetic tunnel junction pattern MTJP1 may include the first free pattern FP1, the first fixed pattern PP1, and the first tunnel barrier pattern TBP1 interposed therebetween. The second magnetic tunnel junction pattern MTJP2 may include the second free pattern FP2, the second fixed pattern PP2, and the second tunnel barrier pattern TBP2 interposed therebetween. The stacking order of the first free pattern FP1, the first fixed pattern PP1, and the first tunnel barrier pattern TBP1 may be the same as that of the second free pattern FP2, the second fixed pattern PP2, and the second tunnel barrier pattern TBP2. Accordingly, the first fixed pattern PP1 may be connected to the drain region (e.g., in or on the substrate 210) of the first selection transistor SE1 through the third conductive pattern 234 and the first contact plug PLG1, similar to the previous example embodiment described with reference to FIG. 7. Also, the second fixed pattern PP2 may be connected to the second bit line BL2 through the second conductive pattern 232.

The second re-deposition layers RD2 may be provided on the sidewalls of the first and second magnetic tunnel junction patterns MTJP1 and MTJP2. Each of the second re-deposition layers RD2 may be provided to have technical features similar to those of the second re-deposition layer RD2 described with reference to FIGS. 1H and 1I. For example, each of the second re-deposition layers RD2 may include the same material as the protection pattern 240r. As an example, in the case where the protection pattern 240r is formed of tungsten oxide, the second re-deposition layer RD2 may be formed of or include tungsten oxide. As another example, in the case where the protection pattern 240r is formed of titanium oxide, the second re-deposition layer RD2 may be formed of or include titanium oxide.

An interlayer insulating layer 250 may be provided to cover the top surface of the second lower insulating layer 220. Further, the interlayer insulating layer 250 may cover the second re-deposition layers RD2. The interlayer insulating layer 250 may be formed of or include, for example, at least one of silicon oxide, silicon nitride, or silicon oxynitride.

A third contact plug PLG3 may be provided to pass through the interlayer insulating layer 250 and may be electrically connected to the first conductive pattern 230. The third contact plug PLG3 may pass through the protection pattern 240r.

The first bit line BL1 and an interconnection pattern INC may be provided on the interlayer insulating layer 250. The first bit line BL1 may be connected to the first top electrode pattern TEP1. The interconnection pattern INC may be connected in common to the second top electrode pattern TEP2 and the third contact plug PLG3. Accordingly, the first free pattern FP1 may be connected to the first bit line BL1 through the first top electrode pattern TEP1, similar to the previous example embodiment described with reference to FIG. 7. The second free pattern FP2 may be connected to the drain region (for example, in or on the substrate 210) of the second selection transistor SE2 through the second top electrode pattern TEP2, the interconnection pattern INC, the third contact plug PLG3, the first conductive pattern 230, and the second contact plug PLG2.

FIGS. 9A through 9E are sectional views illustrating a method of fabricating the unit memory cell of FIG. 8. For concise description, an element previously described with reference to FIG. 8 may be identified by a similar or identical reference number without repeating an overlapping description thereof.

Figure 9A:
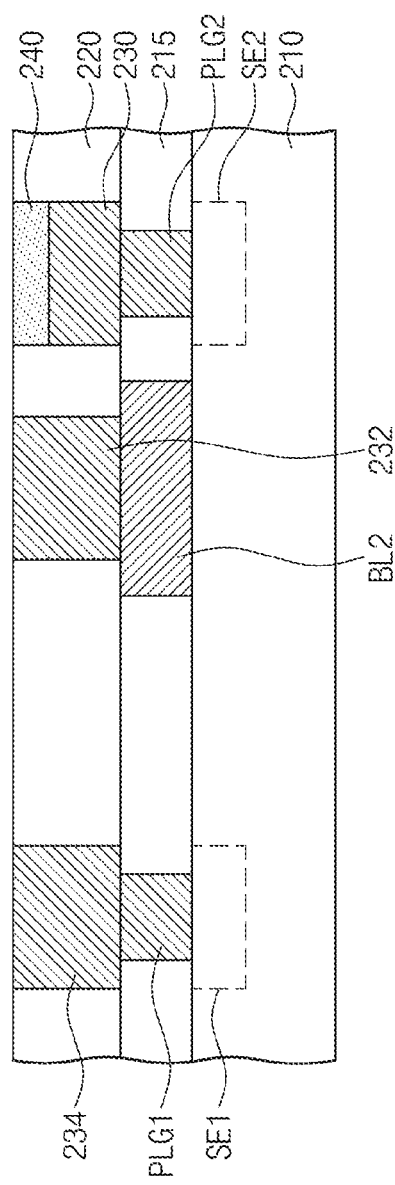
FIGS. 9A through 9E are sectional views illustrating a method of fabricating the unit memory cell of FIG. 8.

Referring to FIG. 9A, the substrate 210 including the first and second selection transistors SE1 and SE2 may be provided. The first lower insulating layer 215 may be formed on the substrate 210. Further, the first and second contact plugs PLG1 and PLG2 and the second bit line BL2 may be formed to pass through the first lower insulating layer 215. The first contact plug PLG1 may be connected to the first selection transistor SE1, and the second contact plug PLG2 may be connected to the second selection transistor SE2. Further, the second bit line BL2 may be formed through the first lower insulating layer 215.

The second lower insulating layer 220 may be formed on the first lower insulating layer 215. Thereafter, the first conductive pattern 230 may be formed to pass through the second lower insulating layer 220 and may be connected to the second contact plug PLG2, and a protection pattern 240 may be formed on the first conductive pattern 230. The first conductive pattern 230 and the protection pattern 240 may be formed in a manner similar to the method of forming the first conductive pattern 130 and the protection pattern 140 as described with reference to FIG. 1A. Accordingly, the protection pattern 240 may include a metal oxide compound, the metallic material of which is the same as that contained in the first conductive pattern 230.

The second and third conductive patterns 232 and 234 may be formed to pass through the second lower insulating layer 220. The second conductive pattern 232 may be connected to the second bit line BL2, and the third conductive pattern 234 may be connected to the first contact plug PLG1.

Figure 9B:
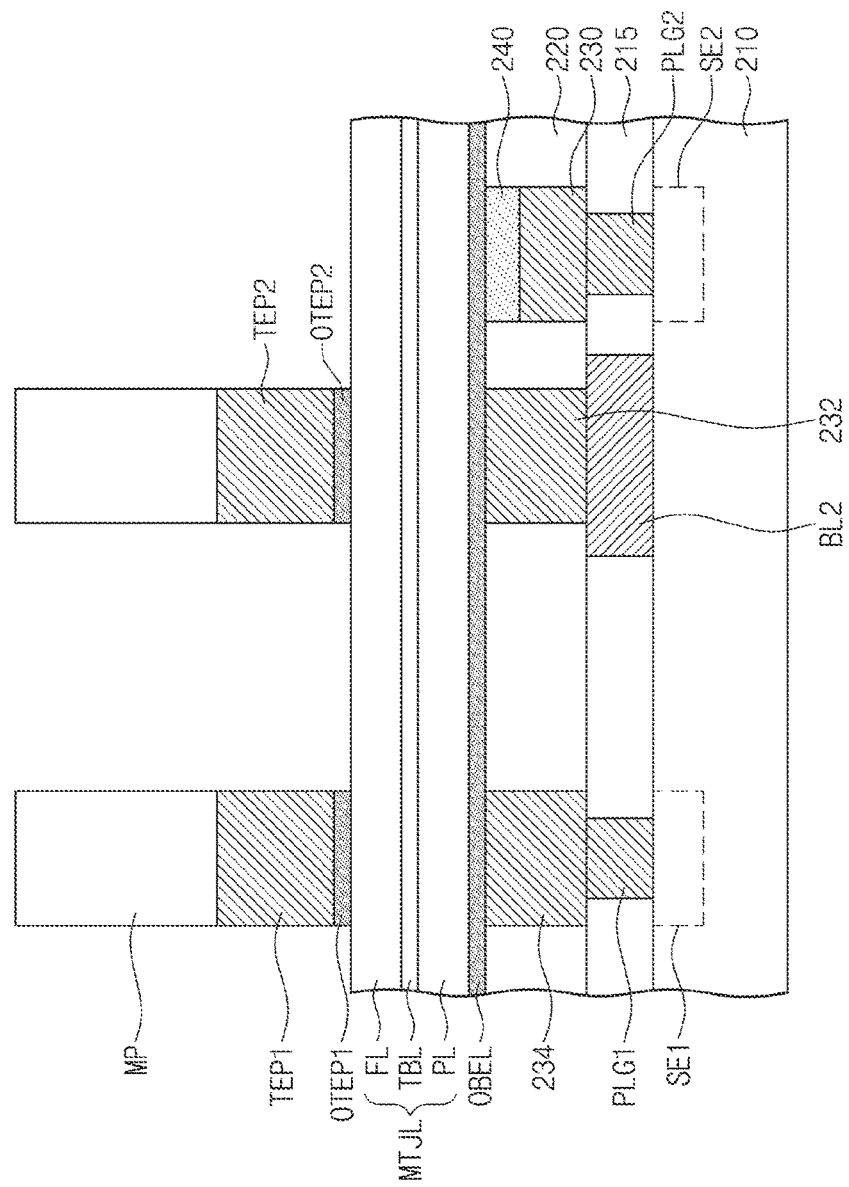

Referring to FIG. 9B, the optional bottom electrode layer OBEL, the magnetic tunnel junction layer MTJL, an optional top electrode layer (not shown), a top electrode layer (not shown), and the mask patterns MP may be sequentially formed on the second lower insulating layer 220. When viewed in a plan view, the mask patterns MP may be overlapped with the second and third conductive patterns 232 and 234, respectively, but may not overlap with the first conductive pattern 230.

As shown in FIG. 9B, the magnetic tunnel junction layer MTJL may include a fixed layer PL, the tunnel barrier layer TBL, and a free layer FL, which are sequentially stacked on the substrate 210, but example embodiments of the inventive concept are not limited thereto. For example, the stacking order of the fixed layer PL and the free layer FL may be changed from the above.

The top electrode layer (not shown) and the optional top electrode layer (not shown) may be sequentially patterned using the mask patterns MP as an etch mask to form the first and second top electrode patterns TEP1 and TEP2 and the first and second optional top electrode patterns OTEP1 and OTEP2.

A method of forming the first and second magnetic tunnel junction patterns MTJP1 and MTJP2 and the first and second optional bottom electrode patterns OBEP1 and OBEP2 will be described with reference to FIGS. 9C and 9D. The formation of the first and second magnetic tunnel junction patterns MTJP1 and MTJP2 and the first and second optional bottom electrode patterns OBEP1 and OBEP2 may include patterning the magnetic tunnel junction layer MTJL and the optional bottom electrode layer OBEL using the mask patterns MP as an etch mask. The patterning of the magnetic tunnel junction layer MTJL and the optional bottom electrode layer OBEL may include sequentially performing a first etching process and a second etching process.

Figure 9C:
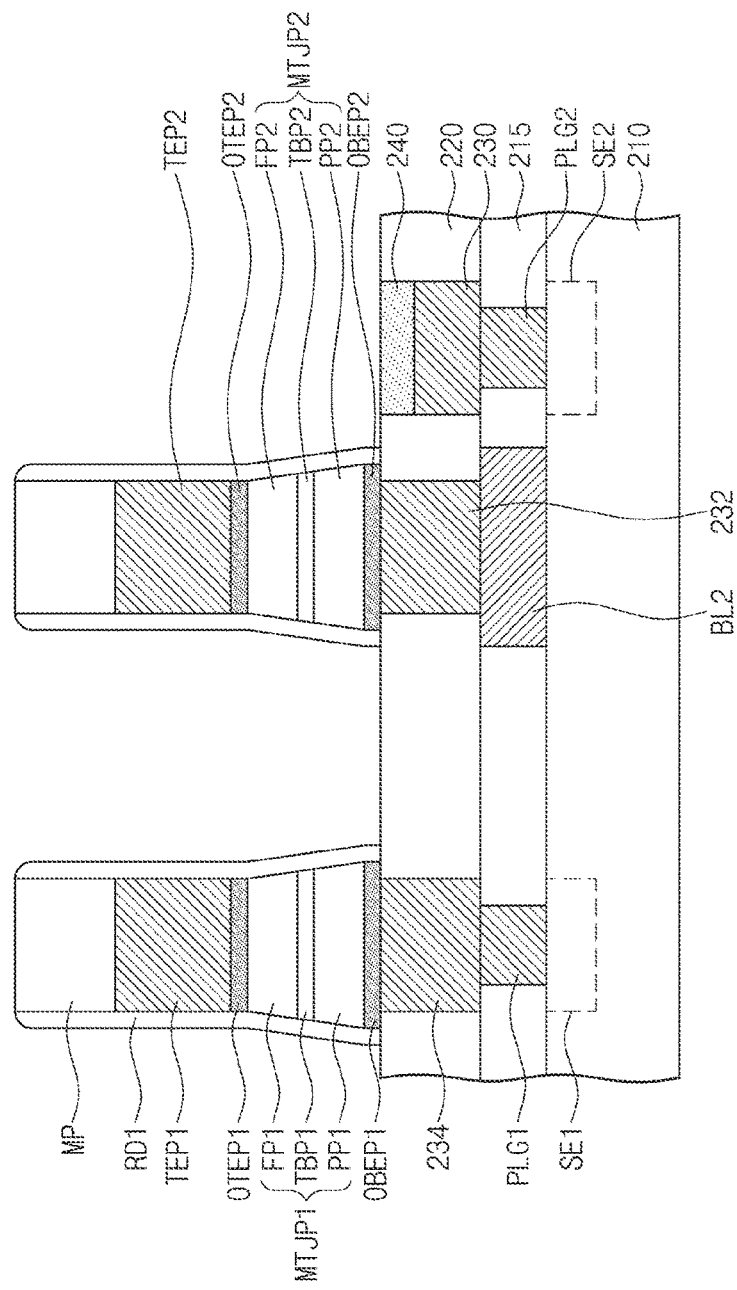

First, as shown in FIG. 9C, the first etching process may be performed. The first etching process may be performed in a manner similar to the first etching process ETCH1 described with reference to FIGS. 1E and 1F.

In particular, the first etching process may be performed using, for example, a sputter etching technique of accelerating atoms or ions of an inactive gas toward the substrate 210 in a direction substantially normal to a top surface of the substrate 210 so that the accelerated atoms or ions collide against the resulting structure. As a result of the first etching process, the top surfaces of the second lower insulating layer 220 and the protection pattern 240 may be exposed and the first and second magnetic tunnel junction patterns MTJP1 and MTJP2 may be formed. As a result of the first etching process, the first re-deposition layers RD1 may be formed on sidewalls of the first and second magnetic tunnel junction patterns MTJP1 and MTJP2. For example, during or after the first etching process, a portion of the magnetic tunnel junction layer MTJL may be re-deposited on the first and second magnetic tunnel junction patterns MTJP1 and MTJP2, thereby forming the first re-deposition layer RD1. Thus, the first re-deposition layer RD1 may include the same material as the magnetic tunnel junction layer MTJL.

Figure 9D:
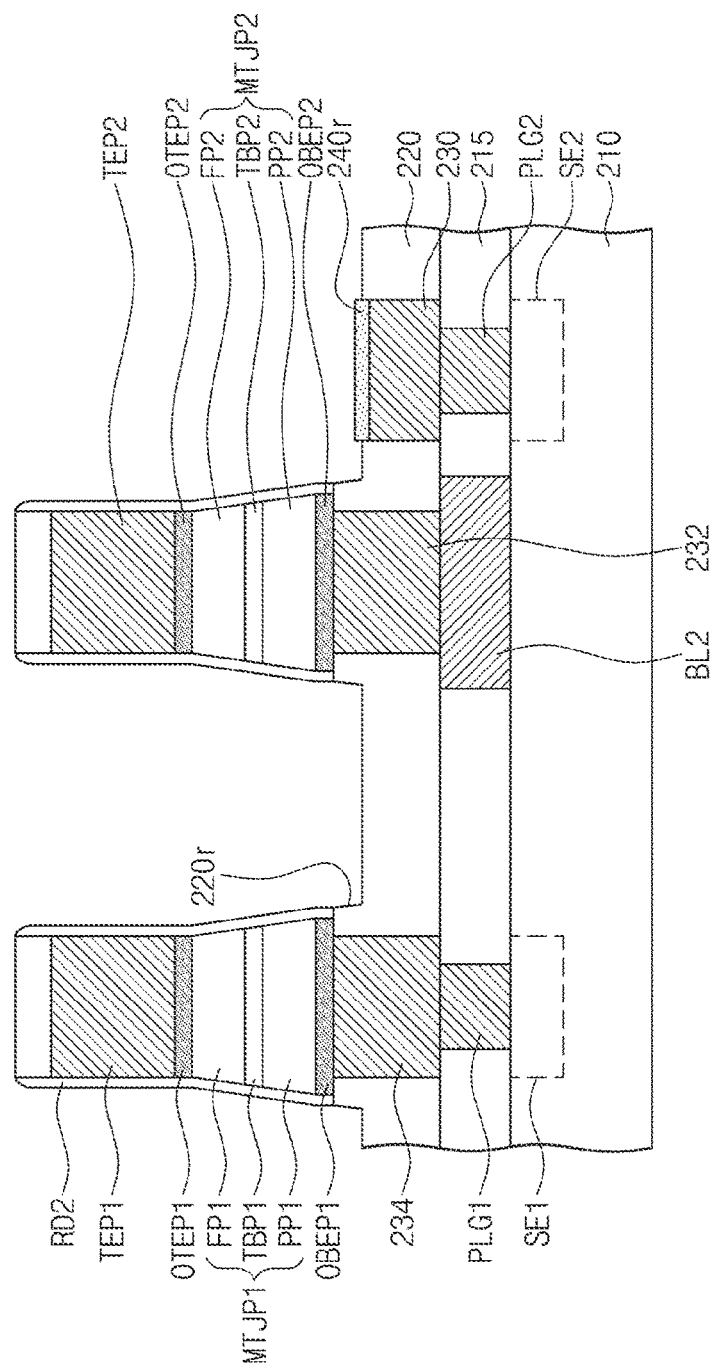

Next, as shown in FIG. 9D, the second etching process may be performed to remove the first re-deposition layer RD1. The second etching process may be performed in a similar manner to the second etching process ETCH2 described with reference to FIGS. 1G and 1H.

In particular, the second etching process may be performed using a sputter etching technique of accelerating atoms or ions of an inactive gas toward the substrate 210 in a direction at an angle to the top surface of the substrate 210 so that the accelerated atoms or ions collide against the resulting structure. As a result of the second etching process, at least a portion (or an entirety) of the protection pattern 240 may be etched. In some embodiments, the protection pattern 240 may be partially etched to leave a portion 240r. As a result of the second etching process, the second re-deposition layers RD2 may be formed on sidewalls of the first and second magnetic tunnel junction patterns MTJP1 and MTJP2. For example, during or after the second etching process, a portion of the protection pattern 240 may be re-deposited on the first and second magnetic tunnel junction patterns MTJP1 and MTJP2, thereby forming the second re-deposition layer RD2 In this case, the second re-deposition layer RD2 may include the same material as the protection pattern 240. The second etching process may be performed to partially etch the second lower insulating layer 220, thereby forming the recess region 220r on the second lower insulating layer 220.

Figure 9E:
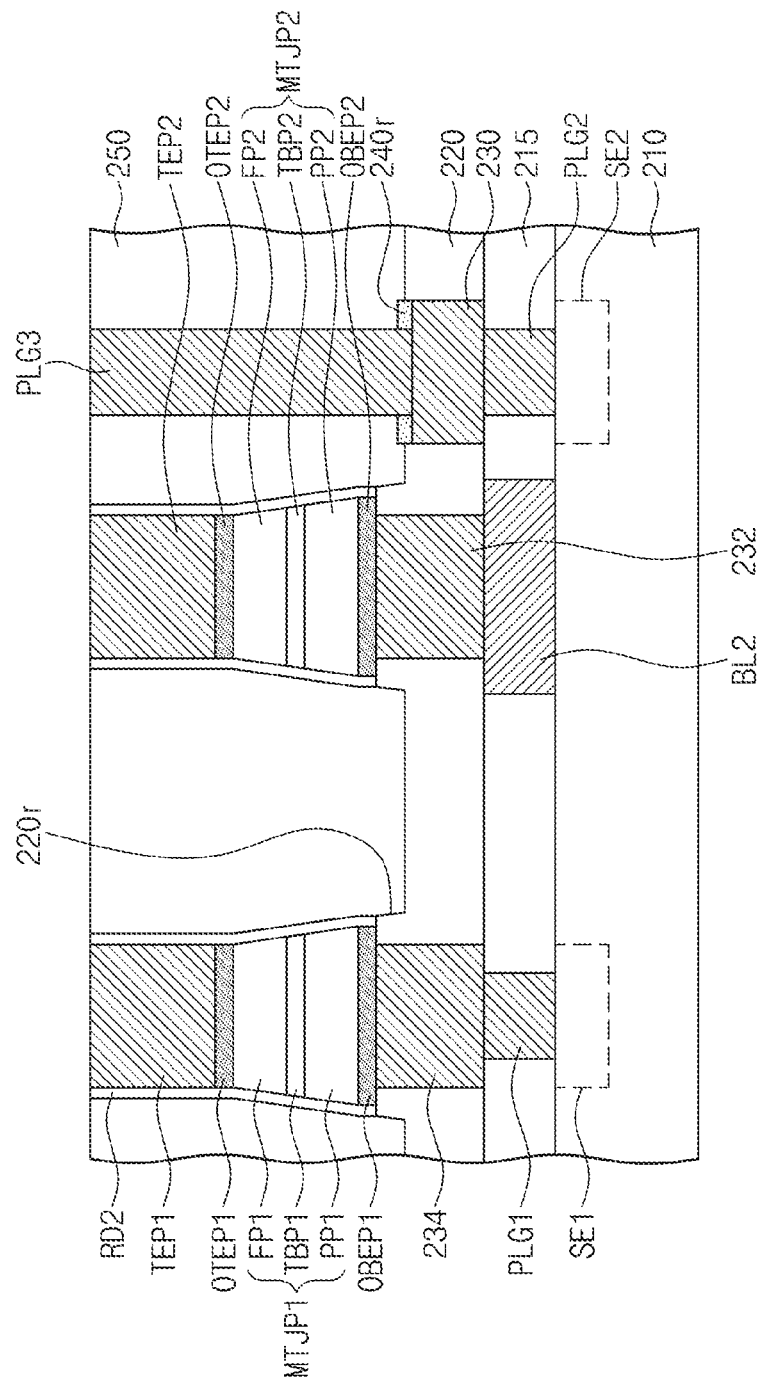

Referring to FIG. 9E, the interlayer insulating layer 250 may be formed to cover a top surface of the second lower insulating layer 220. Furthermore, the interlayer insulating layer 250 may cover the second re-deposition layers RD2. The third contact plug PLG3 may be formed to pass through the interlayer insulating layer 250 and to be electrically connected to the first conductive pattern 230. The third contact plug PLG3 may be formed to pass through the remaining portion 240r of the protection pattern 240.

Referring back to FIG. 8, the first bit line BL1 and the interconnection pattern INC may be formed on the interlayer insulating layer 250. The first bit line BL1 may be connected to the first top electrode pattern TEP1, and the interconnection pattern INC may be connected to both of the second top electrode pattern TEP and the third contact plug PLG3.

In a method of fabricating a unit memory cell according to some example embodiments of the inventive concepts, the protection pattern 240 may be formed on the first conductive pattern 230. The protection pattern 240 may prevent the first conductive pattern 230 from being etched during the etching process for forming the first and second magnetic tunnel junction patterns MTJP1 and MTJP2 and from being re-deposited on the sidewalls of the first and second magnetic tunnel junction patterns MTJP1 and MTJP2. Accordingly, a short circuit between the free and fixed patterns of each of the first and second magnetic tunnel junction patterns MTJP1 and MTJP2 may be prevented.

In a method of fabricating a unit memory cell according to some example embodiments of the inventive concepts, a portion of the protection pattern 240 may be etched and re-deposited on the sidewalls of the first and second magnetic tunnel junction patterns MTJP1 and MTJP2, during the etching process for removing the first re-deposition layer RD1. Because the protection pattern 240 includes an insulating material, the re-deposition of the protection pattern 240 may not lead to an electric short circuit between the free and fixed patterns of each of the first and second magnetic tunnel junction patterns MTJP1 and MTJP2.

Figure 10:
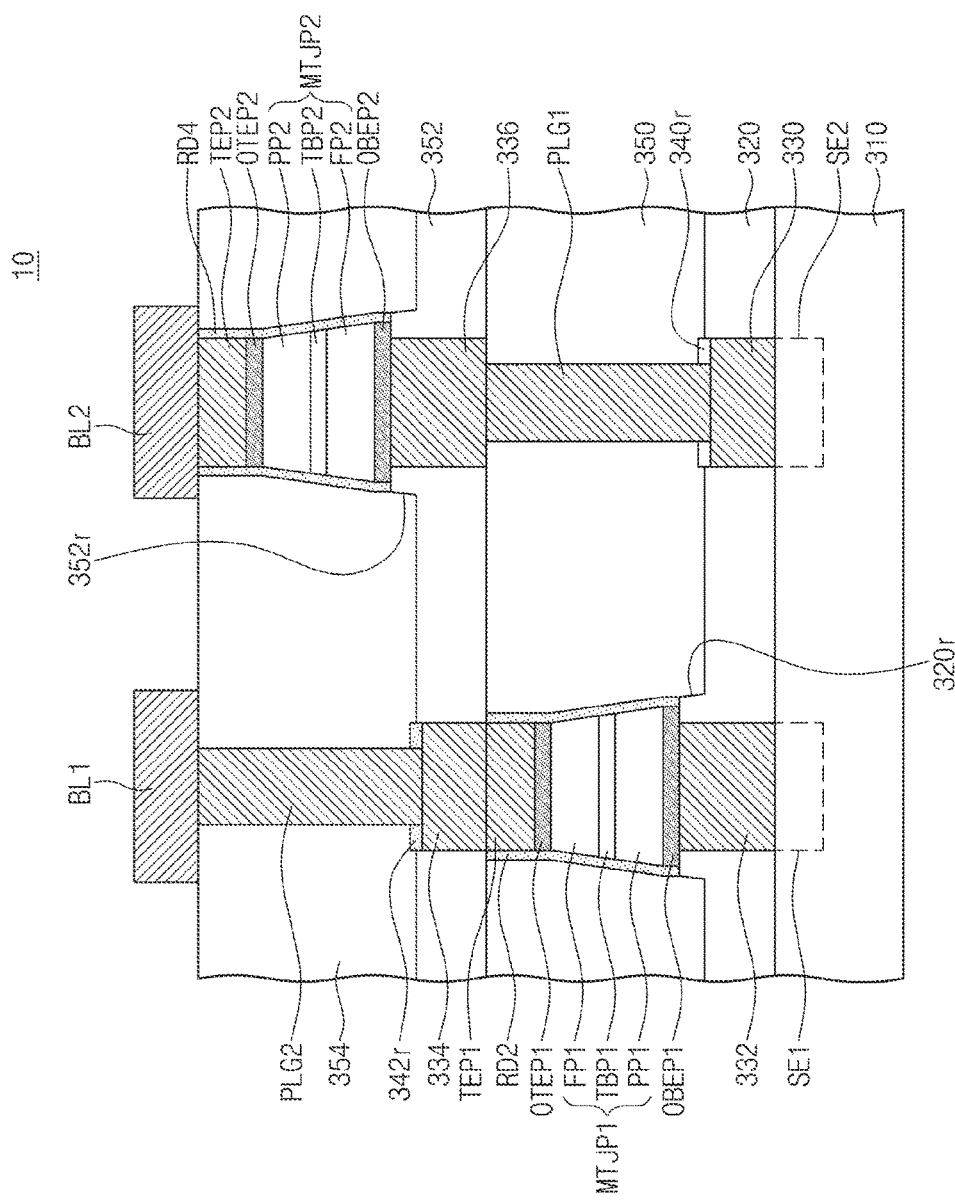
FIG. 10 is a sectional view illustrating another example of a unit memory cell according to an example embodiment of the inventive concepts.

FIG. 10 is a sectional view illustrating another example of a unit memory cell according to an example embodiment of the inventive concepts. For example, FIG. 10 may be a sectional view illustrating the unit memory cell of FIG. 7.

Referring to FIG. 10, a substrate 310 may be provided. The substrate 310 may include the first and second selection transistors SE1 and SE2. The first and second selection transistors SE1 and SE2 may be controlled by one of the word lines WL (not shown). Furthermore, the source line SL may be connected in common to source regions of the first and second selection transistors SE1 and SE2 (not shown).

A lower insulating layer 320 may be provided on the substrate 310. The lower insulating layer 320 may have technical features similar to those of the lower insulating layer 120 described with reference to FIGS. 1I and 1J. For example, the lower insulating layer 320 may have a top surface defining a recess region 320r.

First and second conductive patterns 330 and 332 may be provided. Further, a first protection pattern 340r may cover a top surface of the first conductive pattern 330. The first conductive pattern 330 may have technical features similar to those of the first conductive pattern 130 described with reference to FIGS. 1I and 1J, and the second conductive pattern 332 may have technical features similar to those of the second conductive pattern 132 described with reference to FIGS. 1I and 1J. The first protection pattern 340r may have technical features similar to those of the protection pattern 140r described with reference to FIGS. 1I and 1J.

In particular, the first conductive pattern 330 and the first protection pattern 340r may pass through the recessed region 320r of the lower insulating layer 320, and the second conductive pattern 332 may pass through an un-recessed portion of the lower insulating layer 320. The first conductive pattern 330 may be connected to a drain region (e.g., in or on the substrate 310) of the second selection transistor SE2, and the second conductive pattern 332 may be connected to a drain region (e.g., in or on the substrate 310) of the first selection transistor SE1. In some example embodiments, the first conductive pattern 330 may have a top surface lower than a bottom surface of the recess region 320r, but example embodiments of the inventive concepts are not limited thereto. The top surface of the second conductive pattern 332 may be higher than a bottom surface of the recess region 320r. The first and second conductive patterns 330 and 332 may include a conductive material. As an example, the first and second conductive patterns 330 and 332 may be formed of or include at least one of metallic materials, for example, copper, aluminum, tungsten, or titanium.

A top surface of the first protection pattern 340r may be at a level higher than the bottom surface of the recess region 320r. Furthermore, the top surface of the first protection pattern 340r may be at a level lower than the top surface of the second conductive pattern 332. The first protection pattern 340r may include an insulating material. As an example, the first protection pattern 340r may be formed of or include at least one of metal oxides (e.g., copper oxide, aluminum oxide, tungsten oxide, titanium oxide, etc.). In the case where the first conductive pattern 330 contains a metallic material, the first protection pattern 340r may include a metal oxide compound, the metallic material of which is the same as that contained in the first conductive pattern 330.

The first optional bottom electrode pattern OBEP1, the first magnetic tunnel junction pattern MTJP1, the first optional top electrode pattern OTEP1, and the first top electrode pattern TEP1 may be sequentially stacked on the second conductive pattern 332.

The first magnetic tunnel junction pattern MTJP1 may include a first free pattern FP1, a first fixed pattern PP1, and a first tunnel barrier pattern TBP1 interposed therebetween. The second magnetic tunnel junction pattern MTJP2 may include a second free pattern FP2, a second fixed pattern PP2, and a second tunnel barrier pattern TBP2 interposed therebetween. The first free pattern FP1, the first fixed pattern PP1, and the first tunnel barrier pattern TBP1 may be stacked in an order opposite to that of the second free pattern FP2, the second fixed pattern PP2, and the second tunnel barrier pattern TBP2. In some embodiments, the first fixed pattern PP1, the first tunnel barrier pattern TBP1, and the first free pattern FP1 may be stacked on the substrate 310 in the order enumerated, as shown in FIG. 10. In this case, similar to the previous example embodiment described with reference to FIG. 7, the first fixed pattern PP1 may be connected to the drain region of the first selection transistor SE1 through the second conductive pattern 332.

The second re-deposition layer RD2 may be formed on the sidewall of the first magnetic tunnel junction pattern MTJP1. The second re-deposition layer RD2 may have technical features similar to those of the second re-deposition layer RD2 described with reference to FIGS. 1I and 1J. For example, the second re-deposition layer RD2 may be formed of or include the same material as the first protection pattern 340r.

A first interlayer insulating layer 350 may cover the top surface of the lower insulating layer 320. Furthermore, the first interlayer insulating layer 350 may cover the second re-deposition layer RD2. The first contact plug PLG1 may pass through the first interlayer insulating layer 350 and to be electrically connected to the first conductive pattern 330.

A second interlayer insulating layer 352 may be provided on the first interlayer insulating layer 350. The second interlayer insulating layer 352 may have technical features similar to those of the lower insulating layer 120 described with reference to FIGS. 1I and 1J. For example, the second interlayer insulating layer 352 may have a top surface defining a recess region 352r.

Third and fourth conductive patterns 334 and 336 may be provided. Further, a second protection pattern 342r may cover a top surface of the third conductive pattern 334. The third conductive pattern 334 may have technical features similar to those of the first conductive pattern 130 described with reference to FIGS. 1I and 1J, and the fourth conductive pattern 336 may have technical features similar to those of the second conductive pattern 132 described with reference to FIGS. 1I and 1J. The second protection pattern 342r may have technical features similar to those of the protection pattern 140r described with reference to FIGS. 1I and 1J.

In particular, the third conductive pattern 334 and the second protection pattern 342r may pass through the recessed portion of the second interlayer insulating layer 352, and the fourth conductive pattern 336 may pass through an un-recessed portion of the second interlayer insulating layer 352. The third conductive pattern 334 may be connected to the first top electrode pattern TEP1, and the fourth conductive pattern 336 may be connected to the first contact plug PLG1. In some example embodiments, the third conductive pattern 334 may have a top surface lower than a bottom surface of the recess region 352r, but example embodiments of the inventive concepts are not limited thereto. The top surface of the fourth conductive pattern 336 may be higher than a bottom surface of the recess region 352r. The third and fourth conductive patterns 334 and 336 may include a conductive material. As an example, the third and fourth conductive patterns 334 and 336 may be formed of or include at least one of metallic materials, for example, copper, aluminum, tungsten, or titanium.

A top surface of the second protection pattern 342r may be higher than the bottom surface of the recess region 352r. Furthermore, the top surface of the second protection pattern 342r may be positioned at a level lower than the top surface of the fourth conductive pattern 336. The second protection pattern 342r may include an insulating material. As an example, the second protection pattern 342r may be formed of or include at least one of metal oxides (e.g., copper oxide, aluminum oxide, tungsten oxide, titanium oxide, etc.). In the case where the third conductive pattern 334 contains a metallic material, the second protection pattern 342r may include a metal oxide compound, the metallic material of which is the same as that contained in the third conductive pattern 334.

The second optional bottom electrode pattern OBEP2, the second magnetic tunnel junction pattern MTJP2, the second optional top electrode pattern OTEP2, and the second top electrode pattern TEP2 may be sequentially stacked on the fourth conductive pattern 336.

The second magnetic tunnel junction pattern MTJP2 may include the second free pattern FP2, the second fixed pattern PP2, and the second tunnel barrier pattern TBP2 interposed therebetween. The second free pattern FP2, the second fixed pattern PP2, and the second tunnel barrier pattern TBP2 may be stacked in an order opposite to that of the first free pattern FP1, the first fixed pattern PP1, and the first tunnel barrier pattern TBP1. Accordingly, as shown in FIG. 10, the second free pattern FP2, the second tunnel barrier pattern TBP2, and the second fixed pattern PP2 may be stacked on the substrate 310 in the order enumerated. In this case, similar to the previous example embodiment described with reference to FIG. 7, the second free pattern FP2 may be connected to the drain region of the second selection transistor SE2 through the fourth conductive pattern 336, the first contact plug PLG1, and the first conductive pattern 330.

A fourth re-deposition layer RD4 may be provided on the sidewall of the second magnetic tunnel junction pattern MTJP2. The fourth re-deposition layer RD4 may have technical features similar to those of the second re-deposition layer RD2 described with reference to FIGS. 1I and 1J. For example, the fourth re-deposition layer RD4 may be formed of or include the same material as the second protection pattern 342r.

A third interlayer insulating layer 354 may cover the top surface of the second interlayer insulating layer 352. The third interlayer insulating layer 354 may also cover the fourth re-deposition layer RD4. The second contact plug PLG2 may pass through the third interlayer insulating layer 354 and to be electrically connected to the third conductive pattern 334.

The first and second bit lines BL1 and BL2 may be provided on the third interlayer insulating layer 354. The first bit line BL1 may be connected to the second contact plug PLG2, and the second bit line BL2 may be connected to the second top electrode pattern TEP2. Accordingly, the first free pattern FP1 may be connected to the first bit line BL1 through the first top electrode pattern TEP1, the third conductive pattern 334, and the second contact plug PLG2, similar to the previous example embodiment described with reference to FIG. 7. Also, the second fixed pattern PP2 may be connected to the second bit line BL2 through the second top electrode pattern TEP2.

FIGS. 11A through 11F are sectional views illustrating a method of fabricating the unit memory cell of FIG. 10. For concise description, an element previously described with reference to FIG. 10 may be identified by a similar or identical reference number without repeating an overlapping description thereof.

Figure 11A:
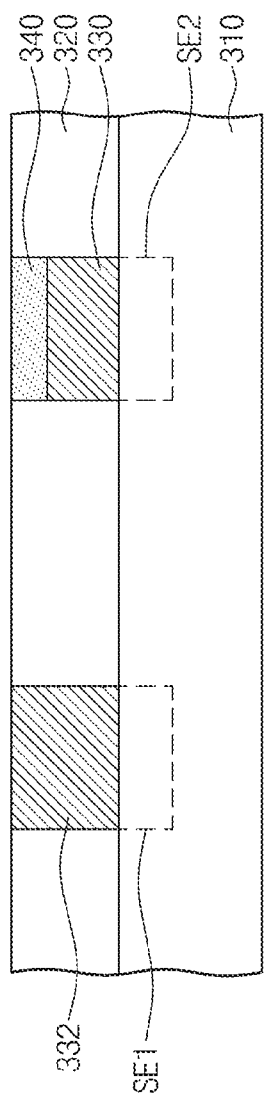
FIGS. 11A through 11F are sectional views illustrating a method of fabricating the unit memory cell of FIG. 10.

Referring to FIG. 11A, the substrate 310 including the first and second selection transistors SE1 and SE2 may be provided. The lower insulating layer 320, the first and second conductive patterns 330 and 332, and a protection pattern 340 may be formed on the substrate 310. The method of forming the lower insulating layer 320, the first and second conductive patterns 330 and 332, and the protection pattern 340 may be similar to the method of forming the lower insulating layer 120, the first and second conductive patterns 130 and 132, and the protection pattern 140, as described with reference to FIGS. 1A, 1B, FIGS. 2A, 2B, and FIGS. 3A through 3D. Thus, a detailed description thereof will be omitted.

Figure 11B:
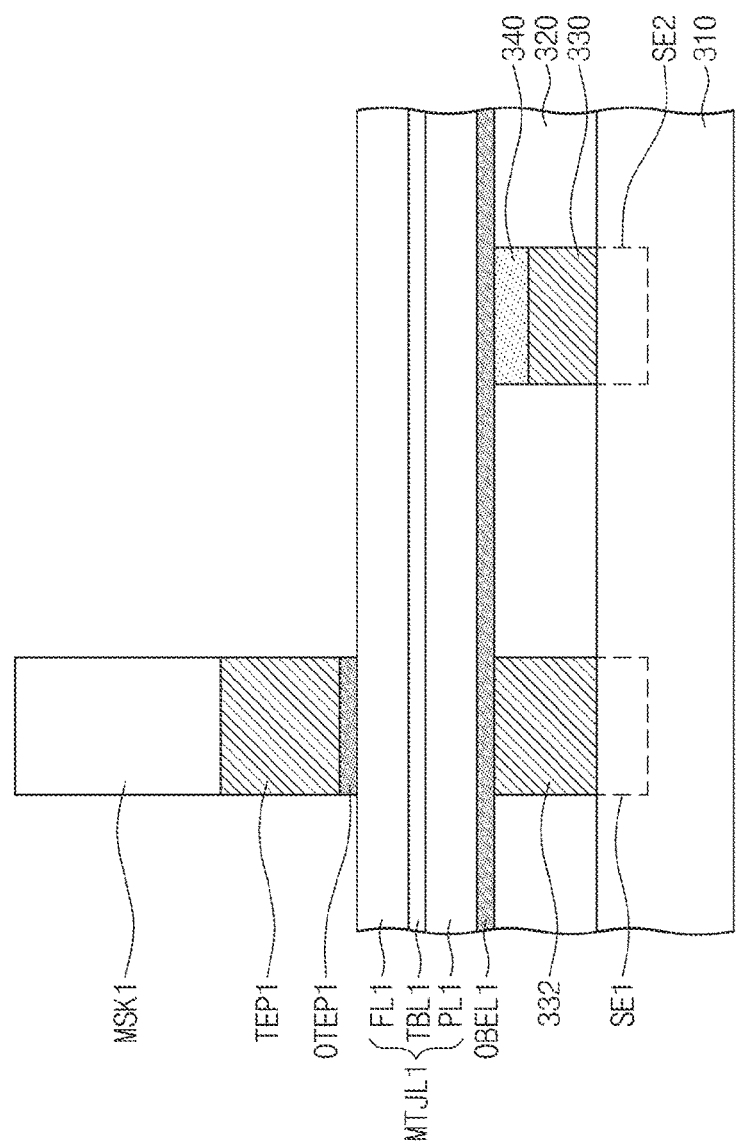

Referring to FIG. 11B, a first optional bottom electrode layer OBEL1, a first magnetic tunnel junction layer MTJL1, a first optional top electrode layer (not shown), and a first top electrode layer (not shown) may be sequentially formed on the lower insulating layer 320. On the first top electrode layer, a first mask pattern MSK1 may be formed to overlap with the second conductive pattern 332.

As shown in FIG. 11B, the first magnetic tunnel junction layer MTJL1 may include a first fixed layer PL1, a first tunnel barrier layer TBL1, and a first free layer FL1, which are sequentially stacked on the substrate 310, but example embodiments of the inventive concepts are not limited thereto. For example, the stacking order of the first fixed layer PL1 and the first free layer FL1 may be different from the above.

The first top electrode layer and the first optional top electrode layer may be sequentially patterned using the first mask pattern MSK1 as an etch mask to form the first top electrode pattern TEP1 and the first optional top electrode pattern OTEP1. The patterning process may be performed using, for example, dry etching techniques (e.g., a reactive ion etching (RIE) method).

Figure 11C:
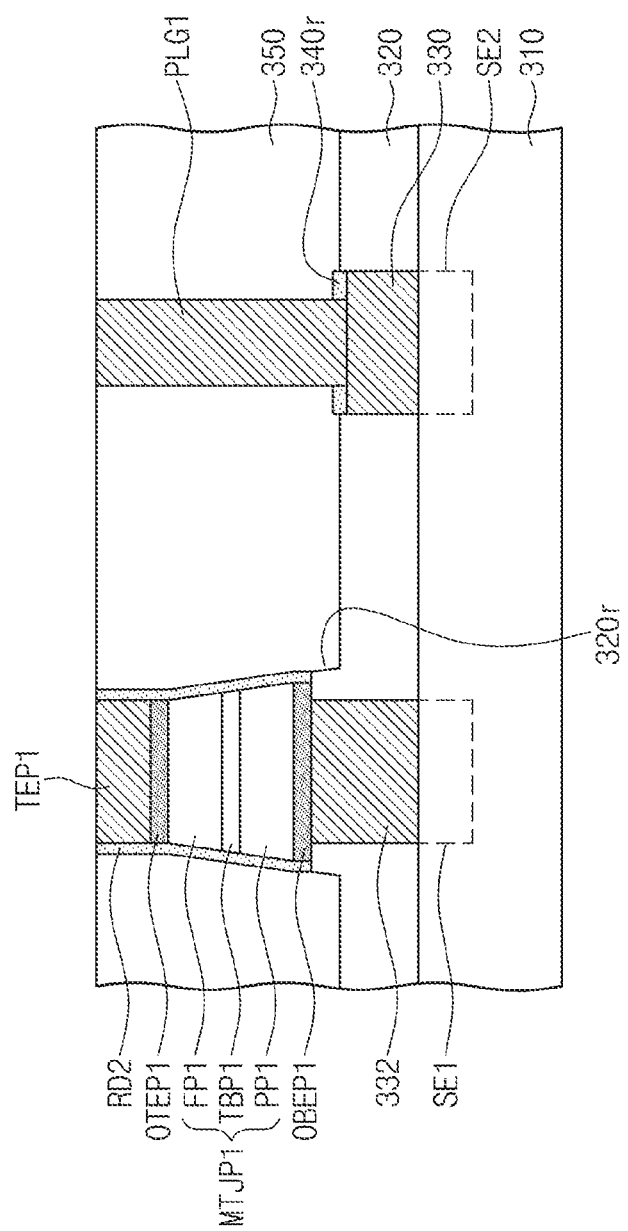

Referring to FIG. 11C, the first optional bottom electrode pattern OBEP1 and the first magnetic tunnel junction pattern MTJP1 may be formed between the second conductive pattern 332 and the first optional top electrode pattern OTEP1. The formation of the first optional bottom electrode pattern OBEP1 and the first magnetic tunnel junction pattern MTJP1 may be performed in a similar manner to the method of forming the optional bottom electrode pattern OBEP and the magnetic tunnel junction pattern MTJP, as described with reference to FIGS. 1E through 1H.

In particular, the first magnetic tunnel junction layer MTJL1 and the first optional bottom electrode layer OBEL1 may be sequentially patterned to form the first magnetic tunnel junction pattern MTJP1 and the first optional bottom electrode pattern OBEP1. The patterning process may include sequentially performing a first etching process and a second etching process.

The first etching process may be performed in a similar manner to the first etching process ETCH1 described with reference to FIGS. 1E and 1F. As a result of the first etching process, a first re-deposition layer (not shown) may be formed on the sidewall of the first magnetic tunnel junction pattern MTJP1. The second etching process may be performed in a similar manner to the second etching process ETCH2 described with reference to FIGS. 1G and 1H. The second etching process may be performed to remove the first re-deposition layer. During this process, at least a portion of the first protection pattern 340 may be removed. For example, the first protection pattern 340 may be partially etched to leave a portion 340r, as shown in FIG. 11B.

As a result of the second etching process, the second re-deposition layer RD2 may be formed on the sidewall of the first magnetic tunnel junction pattern MTJP1. For example, during or after the second etching process, a portion of the first protection pattern 340 may be re-deposited on the first magnetic tunnel junction pattern MTJP1, thereby forming the second re-deposition layer RD2. The second re-deposition layer RD2 may include the same material as the first protection pattern 340.

The second etching process may be performed to partially etch the lower insulating layer 320, thereby forming the recess region 320r on the lower insulating layer 320.

The first interlayer insulating layer 350 may be formed on the lower insulating layer 320. Thereafter, the first contact plug PLG1 may be formed to pass through the first interlayer insulating layer 350 and the remaining portion 340r of the first protection pattern 340 and may be connected to the first conductive pattern 330.

Figure 11D:
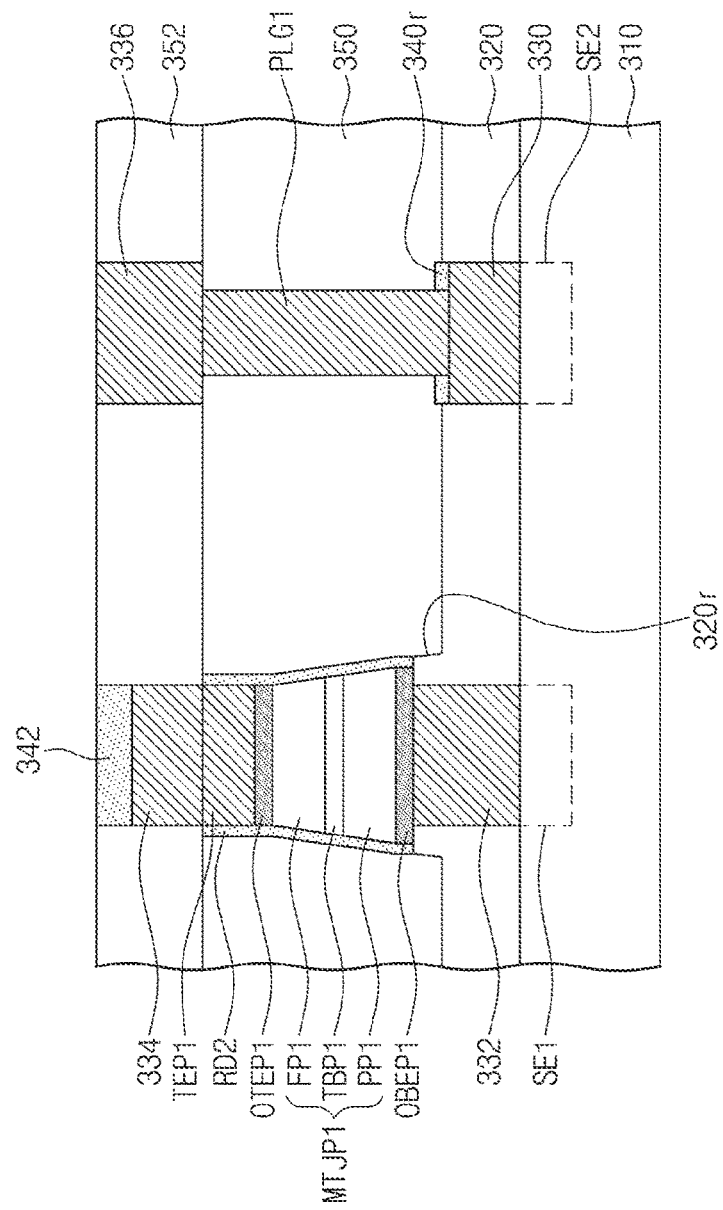

Referring to FIG. 11D, the second interlayered insulating layer 352 may be formed on the first interlayer insulating layer 350. Thereafter, the third conductive pattern 334 may be formed to pass through the second interlayer insulating layer 352 and may be connected to the first top electrode pattern TEP1, and a second protection pattern 342 may be formed on the third conductive pattern 334. The method of forming the third conductive pattern 334 and the second protection pattern 342 may be similar to the method of forming the first conductive pattern 130 and the protection pattern 140, as described with reference to FIGS. 1A, 2A, FIG. 2B, and FIGS. 3A through 3D, and thus, a detailed description thereof will be omitted. Thereafter, the fourth conductive pattern 336 may be formed to pass through the second interlayer insulating layer 352 and may be connected to the first contact plug PLG1.

Figure 11E:
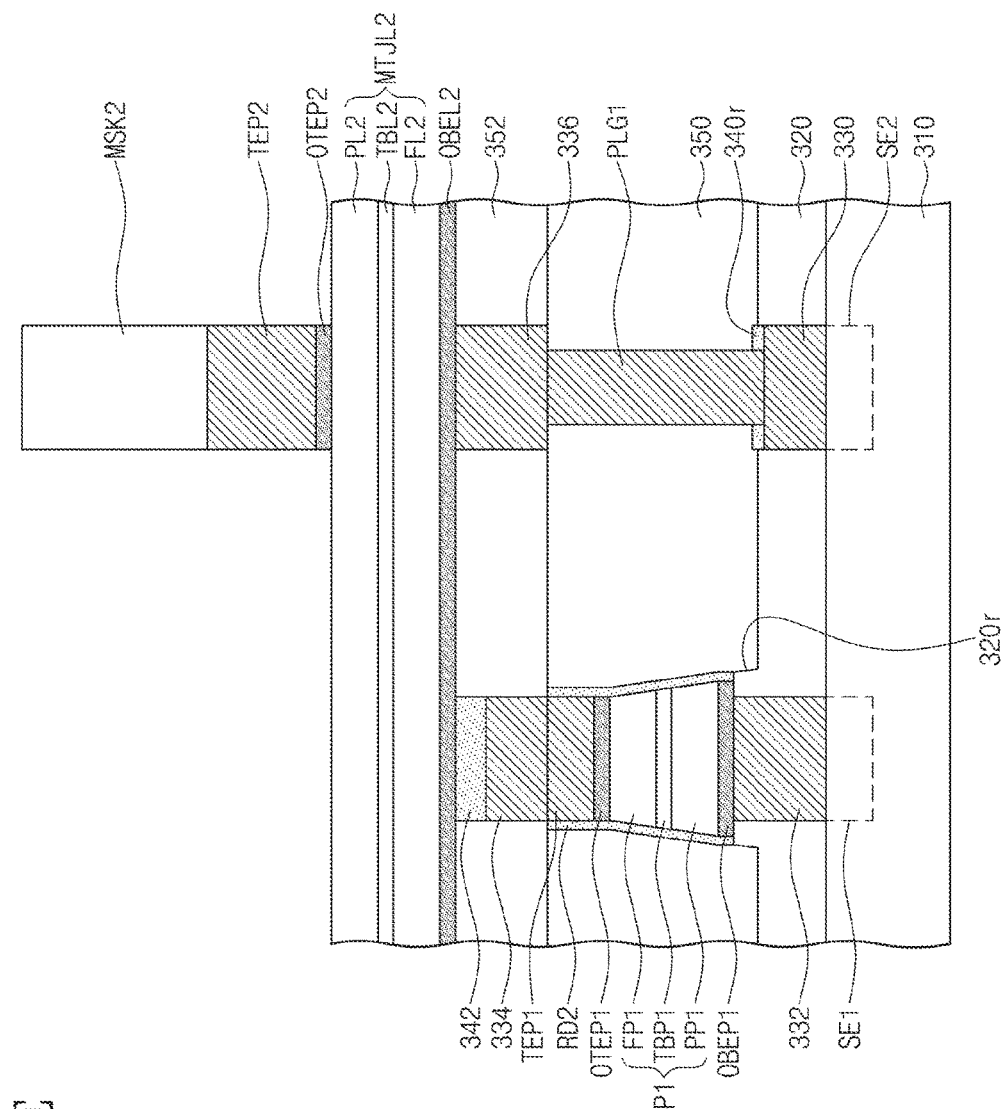

Referring to FIG. 11E, a second optional bottom electrode layer OBEL2, a second magnetic tunnel junction layer MTJL2, a second optional top electrode layer (not shown), and a second top electrode layer (not shown) may be sequentially formed on a second interlayer insulating layer 352. A second mask pattern MSK2 may be formed on the second top electrode layer to overlap with the fourth conductive pattern 336.

The second magnetic tunnel junction layer MTJL2 may include a second free layer FL2, a second fixed layer PL2, and a second tunnel barrier layer TBL2 interposed between the second free layer FL2 and the second fixed layer PL2. The second free layer FL2, the second fixed layer PL2, and the second tunnel barrier layer TBL2 may be stacked in an order opposite to that of the first free layer FL1, the first fixed layer PL1, and the first tunnel barrier layer TBL1.

As shown in FIGS. 11B and 11E, the first fixed layer PL1, the first tunnel barrier layer TBL1, and the first free layer FL1 are sequentially stacked, the second free layer FL2, the second tunnel barrier layer TBL2, and the second fixed layer PL2 may be sequentially the substrate 310 in the order enumerated. Alternatively, the first free layer FL1, the first tunnel barrier layer TBL1, and the first fixed layer PL1 are sequentially stacked, the second fixed layer PL2, the second tunnel barrier layer TBL2, and the second free layer FL2 may be sequentially stacked on the substrate 310 in the order enumerated.

The second top electrode layer and the second optional top electrode layer may be sequentially patterned using the second mask pattern MSK2 as an etch mask to form the second top electrode pattern TEP2 and the second optional top electrode pattern OTEP2. The patterning process may be performed using, for example, dry etching techniques (e.g., a reactive ion etching (RIE) method).

Figure 11F:
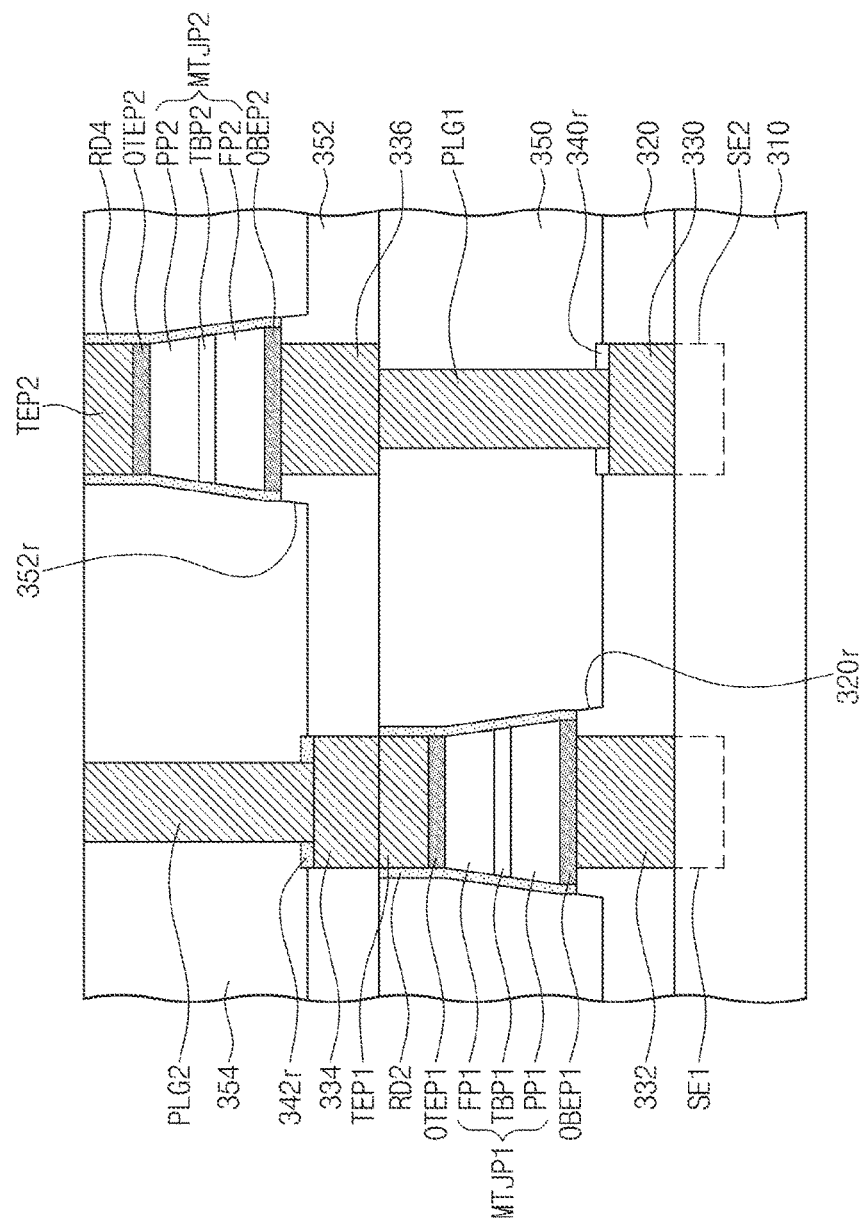

Referring to FIG. 11F, the second optional bottom electrode pattern OBEP2 and the second magnetic tunnel junction pattern MTJP2 may be formed between the fourth conductive pattern 336 and the second optional top electrode pattern OTEP2. The formation of the second optional bottom electrode pattern OBEP2 and the second magnetic tunnel junction pattern MTJP2 may be performed in a similar manner to the method of forming the optional bottom electrode pattern OBEP and the magnetic tunnel junction pattern MTJP, as described with reference to FIGS. 1E through 1H.

In particular, the second magnetic tunnel junction layer MTJL2 and the second optional bottom electrode layer OBEL2 may be sequentially patterned to form the second magnetic tunnel junction pattern MTJP2 and the second optional bottom electrode pattern OBEP2. The patterning process may include sequentially performing a third etching process and a fourth etching process.

The third etching process may be performed in a similar manner to the first etching process ETCH1 described with reference to FIGS. 1E and 1F. As a result of the third etching process, a third re-deposition layer (not shown) may be formed on the sidewall of the second magnetic tunnel junction pattern MTJP2. The fourth etching process may be performed in a similar manner to the second etching process ETCH2 described with reference to FIGS. 1G and 1H. For example, the fourth etching process may be performed to remove the third re-deposition layer, and during this process, at least a portion of the second protection pattern 342 may be removed. In some example embodiments, the second protection pattern 342 may be at least partially etched to leave a portion 342r, as shown in FIG. 11F.

As a result of the fourth etching process, the fourth re-deposition layer RD4 may be formed on the sidewall of the second magnetic tunnel junction pattern MTJP2. For example, during or after the fourth etching process, a portion of the second protection pattern 342 may be re-deposited on the second magnetic tunnel junction pattern MTJP2, thereby forming the fourth re-deposition layer RD4. The fourth re-deposition layer RD4 may include the same material as the second protection pattern 342.

The fourth etching process may be performed to partially etch the second interlayer insulating layer 352. During this case, the recess region 352r may be formed on the second interlayer insulating layer 352.

The third interlayer insulating layer 354 may be formed on the second interlayer insulating layer 352. Thereafter, the second contact plug PLG2 may be formed to pass through the third interlayer insulating layer 354 and the remaining portion 342r of the second protection pattern 342 and may be connected to the third conductive pattern 334.

Referring back to FIG. 10, the first bit line BL1 and the second bit line BL2 may be formed on the third interlayer insulating layer 354 and may be connected to the second contact plug PLG2 and the second top electrode pattern TEP2, respectively.

In a method of fabricating a unit memory cell according to some example embodiments of the inventive concepts, the first protection pattern 340 may be formed on the first conductive pattern 330 and the second protection pattern 342 may be formed on the third conductive pattern 334. The first protection pattern 340 may prevent the first conductive pattern 330 from being etched in the etching process for forming the first magnetic tunnel junction pattern MTJP1 and from being re-deposited on the sidewall of the first magnetic tunnel junction pattern MTJP1. Accordingly, a short circuit between the free and fixed patterns of the first magnetic tunnel junction pattern MTJP1 may be prevented. Similarly, the second protection pattern 342 may prevent the third conductive pattern 334 from being etched in the etching process for forming the second magnetic tunnel junction pattern MTJP2 and from being re-deposited on the sidewall of the second magnetic tunnel junction pattern MTJP2. Accordingly, a short circuit between the free and fixed patterns of the second magnetic tunnel junction pattern MTJP2 may be prevented.

In a method of fabricating a unit memory cell according to some example embodiments of the inventive concepts, during the etching process for forming the first or second magnetic tunnel junction pattern MTJP1 or MTJP2, the first or second protection pattern 340 or 342 may be partially etched and may be re-deposited on the sidewall of the first or second magnetic tunnel junction pattern MTJP1 or MTJP2. Because the first and second protection patterns 340 and 342 are formed of include an insulating material, the re-deposition of the first or second protection pattern 340 or 342 may not lead to an electric short circuit between the free and fixed patterns of each of the first and second magnetic tunnel junction patterns MTJP1 and MTJP2.

In a method of fabricating a memory device according to some example embodiments of the inventive concepts, a protection pattern may be formed on a conductive pattern. The protection pattern may prevent the conductive pattern from being etched in an etching process for forming the magnetic tunnel junction pattern and from being re-deposited on a sidewall of a magnetic tunnel junction pattern. Accordingly, a short circuit between free and pinned patterns of the magnetic tunnel junction pattern may be prevented.

Furthermore, the protection pattern may be formed of or include an insulating material. In the etching process for forming the magnetic tunnel junction pattern, a portion of the protection pattern may be etched and re-deposited on the sidewall of the magnetic tunnel junction pattern. Because the protection pattern is formed of or includes an insulating material, the re-deposition of the protection pattern may not lead to a short circuit between the free and fixed patterns of the magnetic tunnel junction pattern.

While some example embodiments of the inventive concepts have been particularly shown and described, it will be understood by one of ordinary skill in the art that variations in form and detail may be made therein without departing from the spirit and scope of the attached claims.

What is claimed is:

1. A memory device, comprising:
   a substrate;
   an insulating layer on the substrate, the insulating layer including a first region having a first top surface and a second region having a second top surface, the second top surface being lower than the first top surface with respect to the substrate, the first region including a first through hole penetrating therethrough, the second region including a second through hole penetrating therethrough;
   a first conductive pattern filling the first through hole;
   a second conductive pattern at least partially filling the second through hole;
   a magnetic tunnel junction pattern on the first conductive pattern; and
   a contact plug coupled to the second conductive pattern.

2. The memory device of claim 1, wherein a top surface of the second conductive pattern is one of substantially coplanar with and under the second top surface of the second region of the insulating layer.

3. The memory device of claim 1, further comprising:
   a protection pattern on the second conductive pattern.

4. The memory device of claim 3, wherein the first conductive pattern includes a metallic material and the protection pattern includes a metallic oxide material.

5. The memory device of claim 3, wherein a top surface of the protection pattern is one of substantially coplanar with and above the second top surface of the second region of the insulating layer.

6. The memory device of claim 1, further comprising:
   an insulating cover layer covering a sidewall of the magnetic tunnel junction pattern, which includes a first magnetic pattern, a second magnetic pattern, and a tunnel barrier pattern interposed therebetween.

7. A memory device, comprising:
   a substrate;
   an insulating layer on the substrate, the insulating layer including a first region having a first top surface and a second region having a second top surface recessed with respect to the first top surface, the first region including a first through hole penetrating therethrough, the second region including a second through hole penetrating therethrough;
   a first conductive pattern filling the first through hole;
   a second conductive pattern at least partially filling the second through hole;
   a protection pattern on the second conductive pattern;
   a magnetic tunnel junction pattern electrically connected to a top surface of the first conductive pattern; and
   a contact plug electrically connected to a top surface of the second conductive pattern, while penetrating the protection pattern such that a residual portion of the protection pattern remains around a bottom portion of the contact plug.

8. The memory device of claim 7, wherein the first conductive pattern includes a metallic material and the protection pattern includes a metallic oxide material.

9. The memory device of claim 7, wherein the top surface of the second conductive pattern is one of substantially coplanar with and under the second top surface of the second region of the insulating layer.

10. The memory device of claim 7, wherein a top surface of the protection pattern is one of substantially coplanar with and above the second top surface of the second region of the insulating layer.

11. The memory device of claim 7, further comprising:
an insulating cover layer covering a sidewall of the magnetic tunnel junction pattern, the magnetic tunnel junction pattern including a first magnetic pattern, a second magnetic pattern, and a tunnel barrier pattern interposed therebetween,
wherein the insulating cover layer includes a same material as the protection pattern.

12. A magnetic memory device, comprising:
a substrate;
an insulating layer on the substrate, the insulating layer including a first region having a first top surface, a second region having a second top surface, and a third region having a third top surface, the third top surface being lower than the first and second top surfaces with respect to the substrate, the first, second, and third regions including first, second, and third through holes penetrating therethrough, respectively;
a first conductive pattern and a second conductive pattern filling the first and second through holes, respectively;
a third conductive pattern at least partially filling the third through hole;
a first magnetic tunnel junction pattern including a first electrode, a second electrode, and a first tunnel barrier pattern interposed therebetween, the first electrode electrically connected to the first conductive pattern;
a second magnetic tunnel junction pattern including a third electrode, a fourth electrode, and a second tunnel barrier pattern interposed therebetween, the third electrode electrically connected to the second conductive pattern; and
a contact plug electrically connected to the third conductive pattern.

13. The magnetic memory device of claim 12, wherein:
the first and second electrodes of the first magnetic tunnel junction pattern are a fixed pattern and a free pattern of the first magnetic tunnel junction pattern, respectively; and
the third and fourth electrodes of the second magnetic tunnel junction pattern are a fixed pattern and a free pattern of the second magnetic tunnel junction pattern, respectively.

14. The magnetic memory device of claim 13, further comprising:
a first bit line electrically connected to the free pattern of the first magnetic tunnel junction pattern; and
a second bit line connected to the fixed pattern of the second magnetic tunnel junction pattern.

15. The magnetic memory device of claim 13, further comprising:
an interconnection pattern electrically connecting the free pattern of the second magnetic tunnel junction pattern to the contact plug.

16. The magnetic memory device of claim 12, further comprising:
a first selection transistor electrically connected to the first conductive pattern; and
a second selection transistor electrically connected to the third conductive pattern.

17. The magnetic memory device of claim 16, further comprising:
a common source line connected in common to source regions of both the first selection transistor and the second selection transistor.

18. The magnetic memory device of claim 12, further comprising:
a protection pattern on the third conductive pattern.

19. The magnetic memory device of claim 18, wherein the first and second conductive patterns include a metallic material, the protection pattern includes a metallic oxide material, and the contact plug is provided through the protection pattern such that the protection pattern remains at around a bottom portion of the third conductive pattern.

20. The magnetic memory device of claim 18, wherein a top surface of the protection pattern is one of substantially coplanar with and above the third top surface of the third region of the insulating layer.

* * * * *